(12) United States Patent  (10) Patent No.: US 8,921,233 B2
Sim et al.  (45) Date of Patent: Dec. 30, 2014

(54) MICROELECTRONIC FABRICATION METHODS USING COMPOSITE LAYERS FOR DOUBLE PATTERNING

(75) Inventors: Jae-hwang Sim, Hwaseong-si (KR); Min-chul Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 374 days.

(21) Appl. No.: 13/241,788

(22) Filed: Sep. 23, 2011

(65) Prior Publication Data

US 2012/0100706 A1  Apr. 26, 2012

(30) Foreign Application Priority Data

Oct. 21, 2010  (KR) ..................  10-2010-0103057

(51) Int. Cl.
*H01L 21/302*  (2006.01)
*H01L 21/461*  (2006.01)
*H01L 21/308*  (2006.01)
*H01L 21/033*  (2006.01)
*H01L 21/311*  (2006.01)
*H01L 27/115*  (2006.01)

(52) U.S. Cl.
CPC ........ *H01L 21/3086* (2013.01); *H01L 21/0337* (2013.01); *H01L 21/0338* (2013.01); *H01L 21/3088* (2013.01); *H01L 21/31144* (2013.01); *H01L 27/11519* (2013.01); *H01L 27/11531* (2013.01); *H01L 27/11548* (2013.01)
USPC ...... 438/717; 438/696; 438/725; 257/E21.25; 430/312

(58) Field of Classification Search
USPC .......... 438/696, 717, 725; 430/312, 314, 316; 257/E21.25
See application file for complete search history.

(56) References Cited

U.S. PATENT DOCUMENTS

2008/0070165 A1* 3/2008 Fischer et al. ................ 430/314

FOREIGN PATENT DOCUMENTS

| JP | 2009-049338 | 3/2009 |
|---|---|---|
| KR | 1020090065148 A | 6/2009 |
| KR | 1020100044541 A | 4/2010 |

* cited by examiner

*Primary Examiner* — Thanhha Pham
(74) *Attorney, Agent, or Firm* — Myers Bigel Sibley & Sajovec, P.A.

(57) ABSTRACT

Some embodiments provide microelectronic fabrication methods in which a sacrificial pattern is formed on a substrate. A spacer formation layer is formed on the substrate, the spacer formation layer covering the sacrificial pattern. The spacer formation layer is etched to expose an upper surface of the sacrificial pattern and to leave at least one spacer on at least one sidewall of the sacrificial pattern. A first portion of the sacrificial pattern having a first width is removed while leaving intact a second portion of the sacrificial pattern having a second width greater than the first width to thereby form a composite mask pattern including the at least one spacer and a portion of the sacrificial layer. An underlying portion of the substrate is etched using the composite mask pattern as an etching mask.

19 Claims, 36 Drawing Sheets

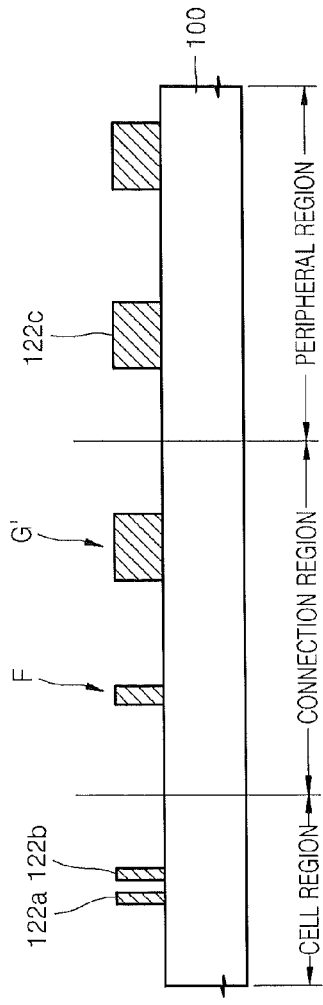
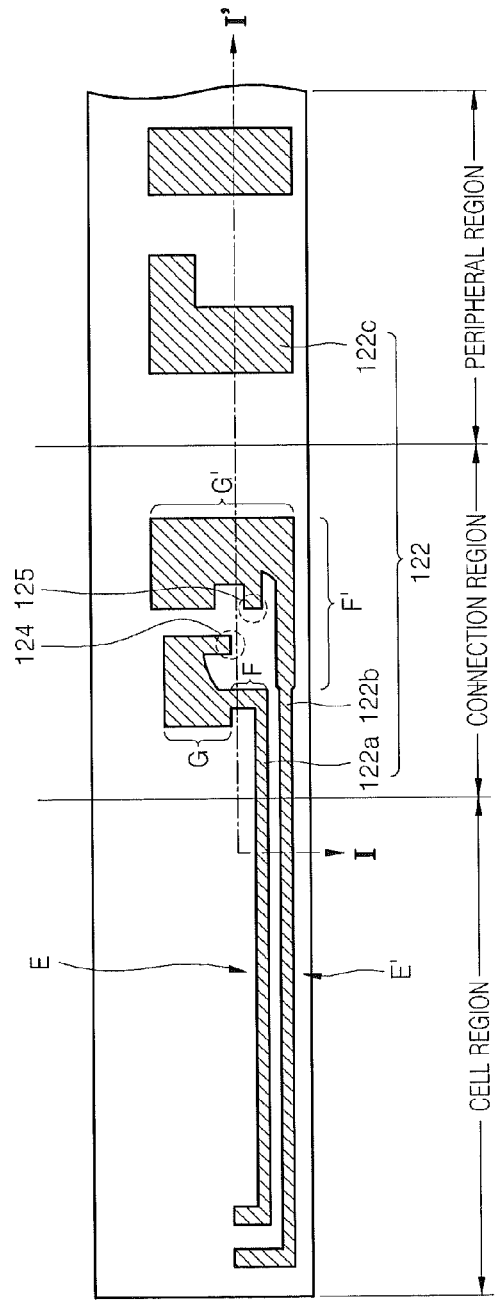
FIG. 1A
FIG. 1B

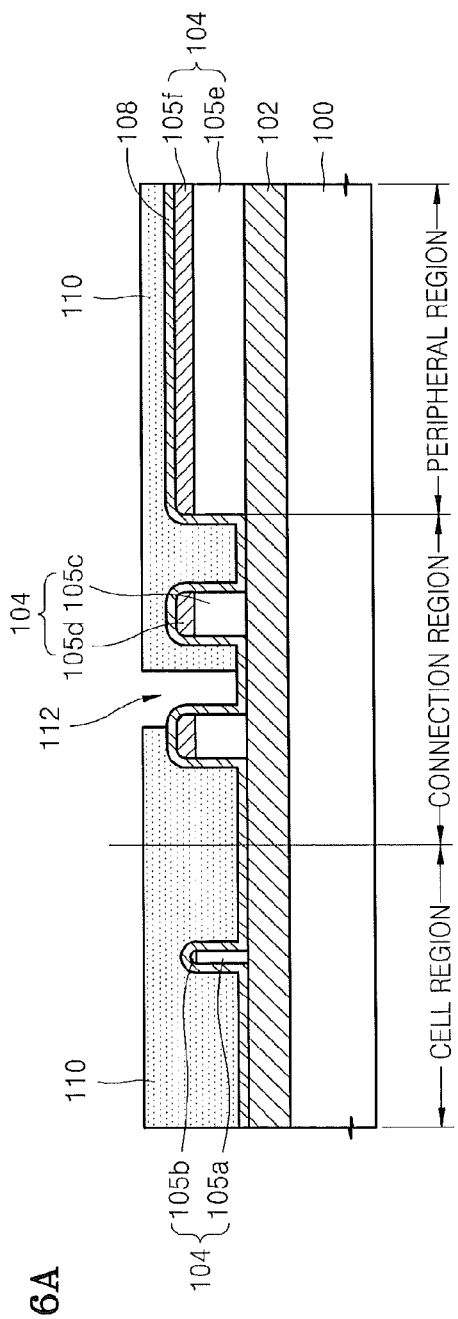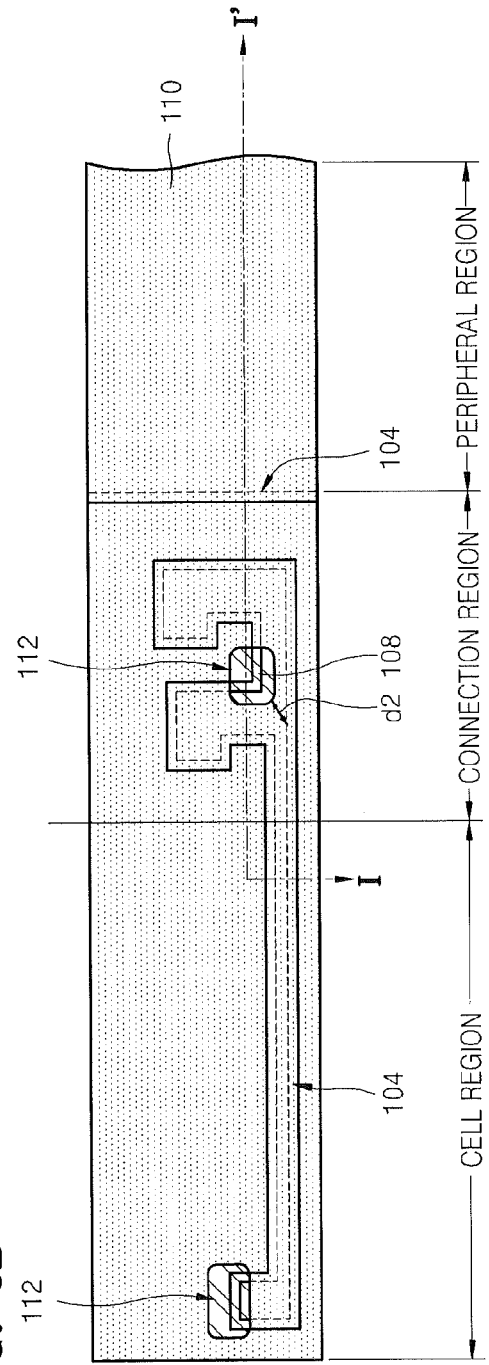

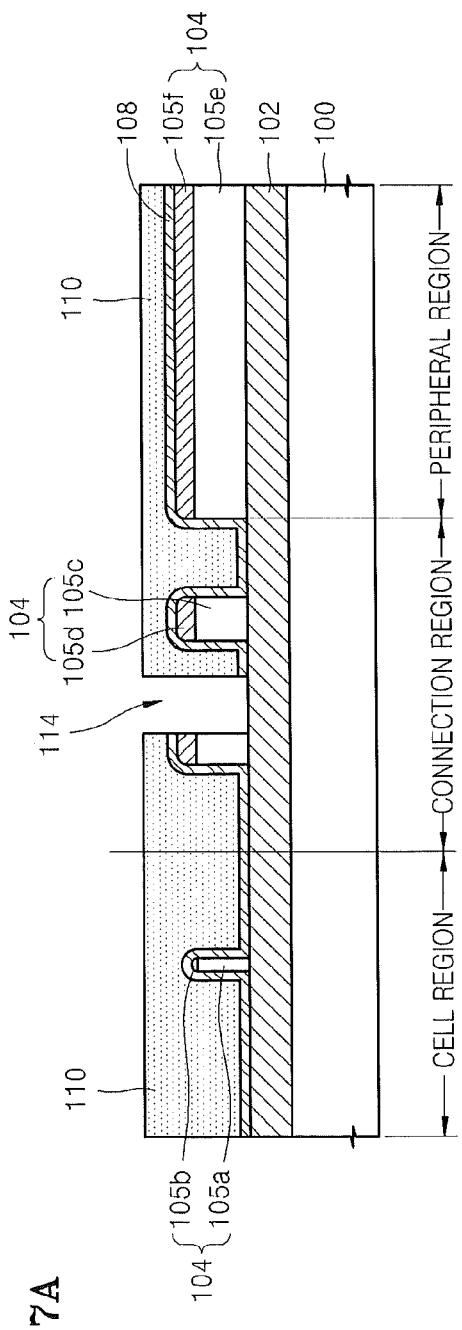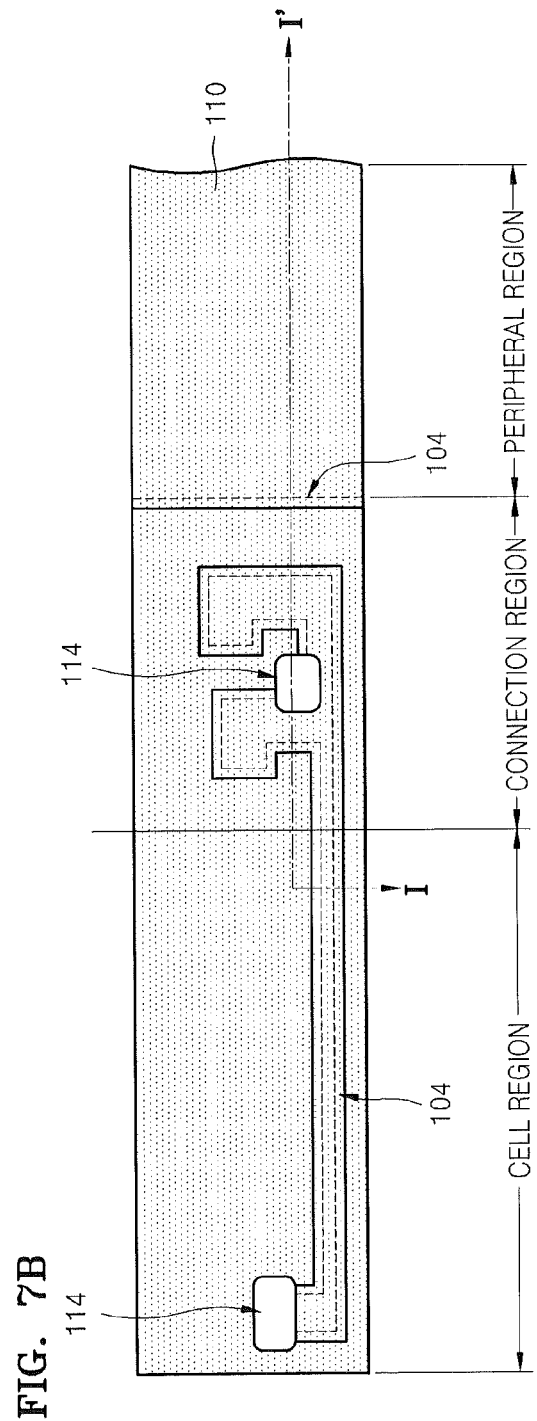

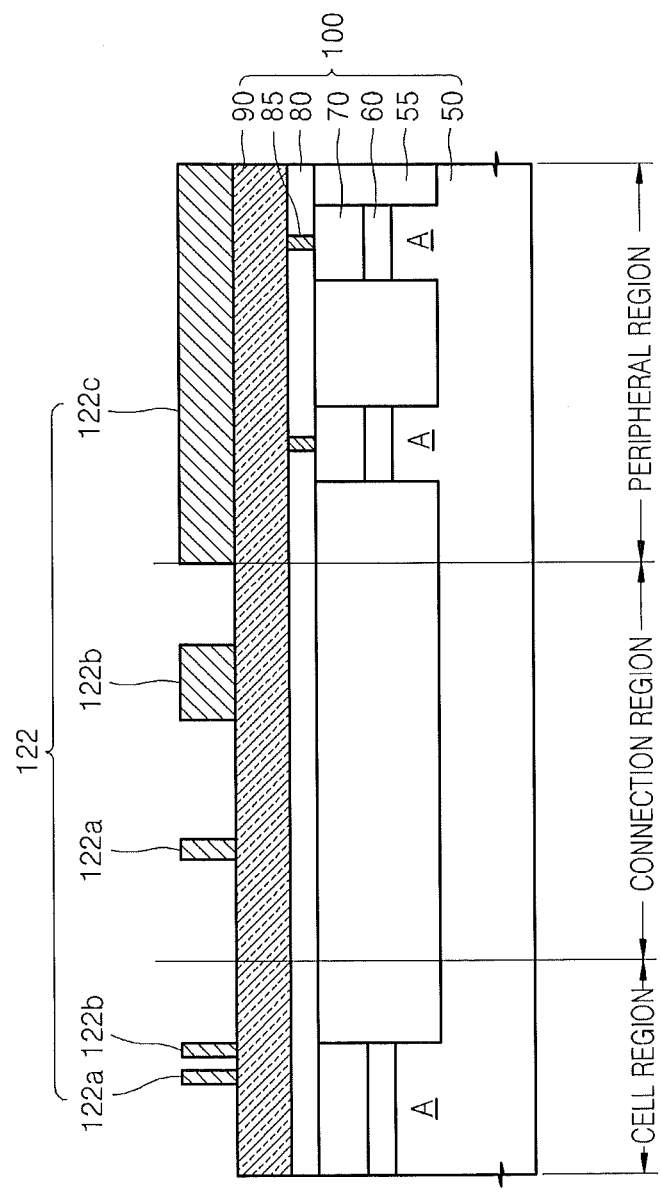

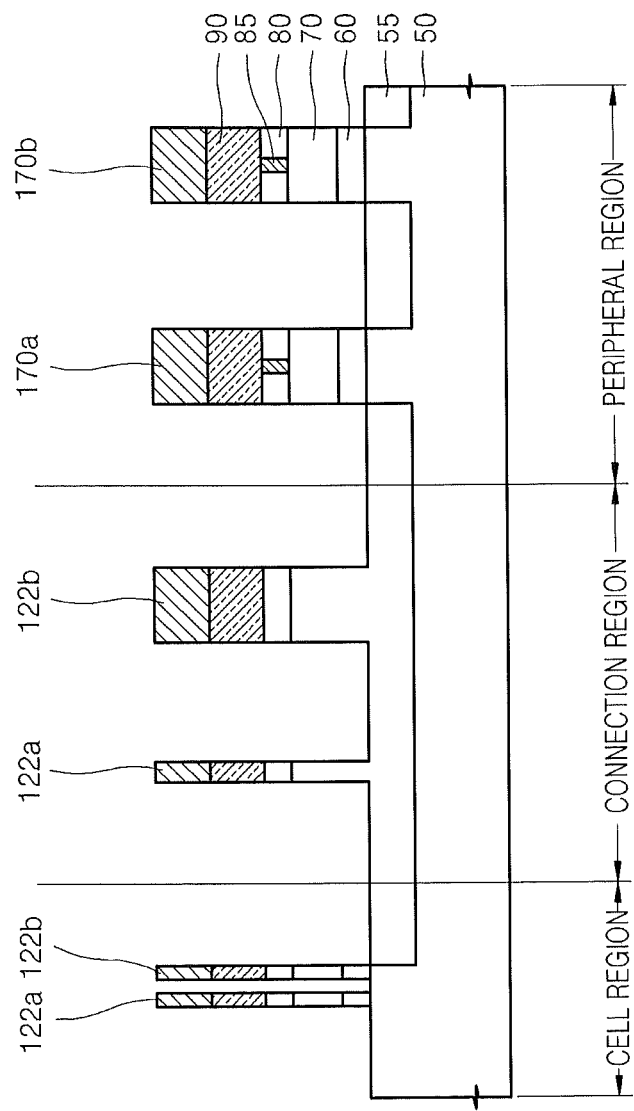

MICROELECTRONIC FABRICATION METHODS USING COMPOSITE LAYERS FOR DOUBLE PATTERNING

CROSS-REFERENCE TO RELATED PATENT APPLICATION

This application claims the benefit of Korean Patent Application No. 10-2010-0103057, filed on Oct. 21, 2010, in the Korean Intellectual Property Office, the disclosure of which is incorporated herein in its entirety by reference.

BACKGROUND

The inventive subject matter relates to microelectronic fabrication methods and devices formed by the same and, more particularly, to fabrication methods using double patterning processes.

A double patterning technique is capable of forming a pattern having an interval less than a minimum pitch that can be exposed by exposure equipment without replacing the exposure equipment. For example, a double patterning technique of forming a spacer on a side wall of a sacrificial pattern formed through photolithography, removing the sacrificial pattern, and etching an etching target layer by using only the spacer as a mask may be used to form a fine pattern.

SUMMARY

According to some embodiments of the inventive subject matter, microelectronic fabrication methods for devices, such as semiconductor devices, are provided. An etching target layer is formed on a substrate including a cell region, a connection region, and a peripheral region. A sacrificial layer is formed on the etching target layer. The sacrificial layer is patterned to form a sacrificial pattern on the cell region and the connection region. At least one sidewall spacer is formed on the sacrificial pattern. The etching target layer is etched using the at least one sidewall spacer as an etch mask in the cell region and using the at least one sidewall spacer and the sacrificial pattern as an etch mask in the connection region to form a first pattern on the cell region and the connection region. A photoresist layer is formed, covering the first pattern. The photoresist layer is patterned to form a photoresist pattern on the peripheral region. The etching target layer is etched using the photoresist pattern as an etch mask to form a second pattern in the peripheral region.

The methods may further include patterning a portion of the photoresist layer on the cell region to form a photoresist pattern on the cell region while patterning the photoresist layer in the peripheral region to form the photoresist pattern on the peripheral region, etching the target layer in the cell region using the photoresist pattern in the cell region as an etch mask to for a third pattern in the cell region and forming a gate electrode of a selection transistor in the cell region using the third pattern as a mask and forming a driving circuit in the peripheral region using the second pattern as a mask.

In some embodiments, the substrate includes a semiconductor substrate, a tunneling isolation layer on the semiconductor substrate, a charge storing layer on the tunneling isolation layer, a blocking insulation layer on the charge storing layer and a gate conductive layer on the blocking insulation layer. The methods may include etching a portion of the gate conductive layer in the cell region while etching the etching target layer using the at least one sidewall spacer as an etch mask in the cell region and using the at least one sidewall spacer and the sacrificial pattern as an etch mask in the connection region to form a first pattern on the cell region and the connection region. The methods may further include etching a portion of the gate conductive layer in the peripheral region while etching the etching target layer in the peripheral region using the photoresist pattern as an etch mask to form the second pattern in the peripheral region. The methods may also include etching a portion of the blocking insulation layer in the peripheral region while etching the etching target layer in the peripheral region using the photoresist pattern as an etch mask to form the second pattern in the peripheral region.

According to further aspects, forming an etching target layer may be preceded by sequentially forming the tunneling isolation layer and the charge storing layer on the semiconductor substrate, etching the tunneling isolation layer, the charge storing layer and the semiconductor substrate to form a trench, forming an isolation layer that fills the trench, etching the isolation layer such that consumption of the isolation layer is greater than consumption of the charge storing layer and forming a blocking insulation layer on the charge storing layer and the isolation layer. Forming the blocking insulation layer may be preceded by etching a portion of the charge storing layer in the peripheral region so that a height of the charge storing layer in the cell region is substantially the same as a height of the charge storing layer in the peripheral region.

In additional embodiments, forming a sacrificial layer includes forming a first material layer on the substrate and forming a second material layer pattern on the first material layer. Patterning the sacrificial layer to form a sacrificial pattern on the cell region and the connection region may include forming a first material layer pattern by etching the first material layer using the second material layer pattern as an etch mask. During the forming of the first material layer pattern, a portion of the second material layer pattern in the cell region may be more etched than a portion of the second material layer pattern in the peripheral region. Etching the etching target layer using the at least one sidewall spacer as an etch mask in the cell region and using the at least one sidewall spacer and the sacrificial pattern as an etch mask in the connection region to form a first pattern on the cell region and the connection region may be preceded by removing the second material layer pattern such that a portion of the second material layer pattern in the cell region is more etched than a portion of the second material layer pattern in the peripheral region.

In some embodiments, forming at least one sidewall spacer on the sacrificial pattern may include forming a spacer formation layer on the sacrificial pattern and etching the spacer formation layer to form the at least one sidewall spacer. In some embodiments, during the forming of the sacrificial pattern, a portion of the sacrificial layer in the peripheral region is not patterned. In further embodiments, during forming of the photoresist pattern, a portion of the photoresist layer in the cell region and the connection region is not patterned.

Further embodiments of the inventive subject matter provide methods in which an etching target layer is formed on a substrate including a cell region, a connection region, and a peripheral region. A sacrificial layer is formed on the etching target layer. The sacrificial layer is patterned to form a sacrificial pattern. A spacer formation layer is formed on the sacrificial pattern, and a portion of the sacrificial pattern and a portion of the spacer formation layer on a portion of the sacrificial pattern are removed. At least one spacer is formed from a portion of the spacer formation layer remaining after etching the spacer formation layer. The etching target layer is etched using the at least one spacer as an etch mask in the cell region and using the at least one spacer and the sacrificial pattern as an etch mask in the connection region. A photoresist layer is formed on the etching target layer. The photoresist layer is patterned to form a photoresist pattern on the peripheral region. The etching target layer is etched using the photoresist pattern as an etch mask.

Additional embodiments provide microelectronic fabrication methods in which a sacrificial pattern is formed on a substrate. A spacer formation layer is formed on the substrate, the spacer formation layer covering the sacrificial pattern. The spacer formation layer is etched to expose an upper surface of the sacrificial pattern and to leave at least one spacer on at least one sidewall of the sacrificial pattern. A first portion of the sacrificial pattern having a first width is removed while leaving intact a second portion of the sacrificial pattern having a second width greater than the first width to thereby form a composite mask pattern including the at least one spacer and a portion of the sacrificial layer. An underlying portion of the substrate is etched using the composite mask pattern as an etching mask.

In some embodiments, the first portion of the sacrificial pattern overlies a cell region of the substrate and the second portion of the sacrificial patter overlies a connection region of the substrate.

In some embodiments, removing a first portion of the sacrificial layer having a first width while leaving intact a second portion of the sacrificial layer having a second width greater than the first width to thereby form a composite mask pattern including the at least one spacer and a portion of the sacrificial layer includes at least two etching operations. For example, the sacrificial pattern may include a first material layer on the substrate and a second material layer on the first material layer. Etching the spacer formation layer to expose an upper surface of the sacrificial pattern and to leave at least one spacer on at least one sidewall of the sacrificial pattern may include etching the spacer formation layer to expose an upper surface of the second material layer. Removing a first portion of the sacrificial pattern having a first width while leaving intact a second portion of the sacrificial pattern having a second width greater than the first width to thereby form a composite mask pattern including the at least one spacer and a portion of the sacrificial layer may include etching the exposed second material layer to remove a portion of the second material layer of the first portion of the sacrificial pattern and expose at portion of the first material layer between spacer portions while leaving intact a portion of the second material layer of the second portion of the sacrificial pattern and etching to remove the exposed portion of the first material layer.

In some embodiments, etching the spacer formation layer to expose an upper surface of the sacrificial pattern and to leave at least one spacer on at least one sidewall of the sacrificial pattern may be preceded by forming a photoresist pattern exposing a portion of the spacer formation layer on a sidewall of the sacrificial pattern and etching to remove the exposed portion of the spacer formation and an adjacent portion of the sacrificial layer while leaving an portion of the spacer formation layer overlying the removed adjacent portion of the sacrificial layer.

In further embodiments, forming a sacrificial pattern on a substrate may be preceded by forming a sacrificial layer on the substrate. Forming a sacrificial pattern on a substrate may include patterning the sacrificial layer to form the sacrificial pattern on cell and connection regions of the substrate while leaving a portion of the sacrificial layer on a peripheral region of the substrate. The spacer formation layer may cover the sacrificial pattern and the portion of the sacrificial layer on the peripheral region and etching the spacer formation layer to expose an upper surface of the sacrificial pattern and to leave at least one spacer on at least one sidewall of the sacrificial pattern may include etching the spacer formation layer to expose an upper surface of the portion of the sacrificial layer on the peripheral region. Removing a first portion of the sacrificial pattern having a first width while leaving intact a second portion of the sacrificial pattern having a second width greater than the first width to thereby form a composite mask pattern including the at least one spacer and a portion of the sacrificial layer may include leaving the portion of the sacrificial layer on the peripheral region. Etching an underlying portion of the substrate using the composite mask pattern as an etching mask may include etching an underlying portion of the substrate using the composite mask pattern as an etching mask to form a first pattern in the cell and connection regions and to leave a material layer in the peripheral region. The methods may further include forming a mask pattern that covers the pattern in the cell and connection regions and that exposes at least a portion of the material layer in the peripheral region and etching the exposed portion of the material layer in the peripheral region to form a second pattern in the peripheral region.

BRIEF DESCRIPTION OF THE DRAWINGS

Exemplary embodiments of the inventive subject matter will be more clearly understood from the following detailed description taken in conjunction with the accompanying drawings in which:

FIGS. 1A and 1B are a cross-sectional view and a plan view schematically showing a semiconductor device according to some embodiments of the inventive subject matter;

FIGS. 3A through 17B are cross-sectional views and plan views illustrating operations for fabricating a semiconductor device according to some embodiments of the inventive subject matter;

FIGS. 18 through 22B are cross-sectional views illustrating operations for fabricating semiconductor devices according to some embodiments of the inventive subject matter;

DETAILED DESCRIPTION

The inventive subject matter will now be described more fully with reference to the accompanying drawings, in which exemplary embodiments of the inventive subject matter are shown. This inventive subject matter may, however, be embodied in many different forms and should not be construed as being limited to the exemplary embodiments set forth herein. Rather, these embodiments are provided so that this disclosure will be thorough and complete, and will fully convey the scope of the inventive subject matter to those of ordinary skill in the art.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive subject matter. For example, a first element discussed below could be termed a second element, and similarly, a second element may be termed a first element without departing from the teachings of this disclosure.

Embodiments of the inventive subject matter are described herein with reference to cross-sectional illustrations that are schematic illustrations of idealized embodiments (and intermediate structures) of the inventive subject matter. As such, variations from the shapes of the illustrations as a result, for example, of manufacturing techniques and/or tolerances, are to be expected. Thus, embodiments of the inventive subject matter should not be construed as being limited to the particular shapes of regions illustrated herein but are to include deviations in shapes that result, for example, from manufacturing.

Figure 2:
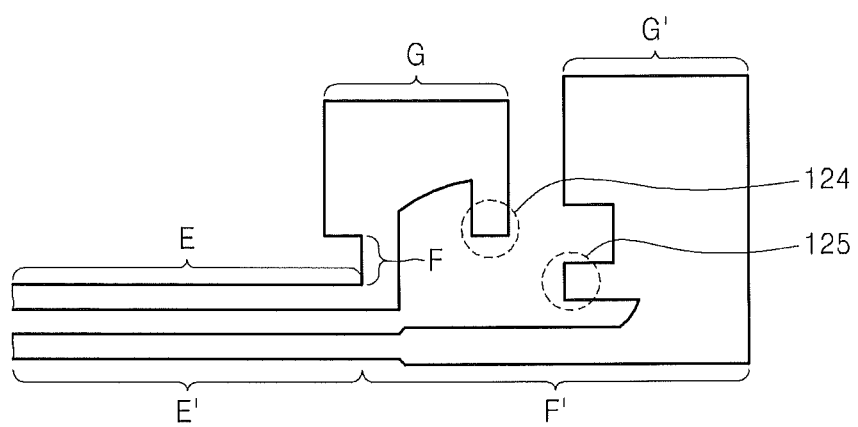
FIG. 2 is an enlarged plan view of a first pattern and a second pattern formed in a cell region and a connection region of the semiconductor device illustrated in FIG. 1.

FIGS. 1A and 1B are a cross-sectional view and a plan view schematically showing a semiconductor device according to some embodiments of the inventive subject matter. FIG. 2 is an enlarged plan view of a first pattern 122a and a second pattern 122b formed in a cell region and a connection region of the semiconductor device illustrated in FIG. 1.

Referring to FIGS. 1A through 2, the semiconductor device may include the first pattern 122a and the second pattern 122b formed in the cell region and the connection region on a substrate 100 of the semiconductor device, and a third pattern 122c formed in a peripheral region on the substrate 100. The first pattern 122a and the second pattern 122b formed in the cell region and the connection region may function as patterns for forming a memory cell of a flash memory. The third pattern 122c formed in the peripheral region may function as a pattern for forming circuits for driving the memory cell of the flash memory.

The first pattern 122a includes a first line pattern E having a first line width and extending in a first direction, a first extended line F connected to an end of the first line pattern E, and a first pad G connected to an end of the first extended line F and having a width greater than the first line width. The first pad G has a width large enough to arrange contact plugs for signal transmission on the first pad G. The first line pattern E may have a line width smaller than a critical line width of photolithography.

The first extended line F is bent in a direction other than the direction in which the first line pattern E extends, For example, as shown in FIG. 1B, the first extended line F is bent perpendicularly to the direction in which the first line pattern E extends. The first extended line F has a greater line width than the first line pattern E and a smaller line width than the first pad G. When the first extended line F and the first line pattern E are formed, an etch loading effect is greatly generated on the first extended line F having a relatively low pattern density, and thus the first extended line F has a greater line width than the first line pattern E.

One part of the first pad G extends long so as to protrude in a lateral direction. The protrusion, namely, a first protruding portion 124, protrudes parallel to the direction in which the first extended line F extends. The first protruding portion 124 has a line shape having a small line width similar to that of the first extended line F. Although the first protruding portion 124 included in the first pad G does not perform any specific function, it is a structural feature of a pattern structure according to some embodiments of the inventive subject matter.

The second pattern 122b is spaced from the first pattern 122a so as to be adjacent to the first pattern 122a. The second pattern 122b includes a second line pattern E' extending parallel to the first line pattern E and having a second line width substantially equal to the first line width, a second extended line F' connected to an end of the second line pattern E', and a second pad G' connected to an end of the second extended line F' and having a width greater than the first line width, The second pad G' has a width large enough to arrange contact plugs for signal transmission on the first pad G'.

In the illustrated embodiments, the second extended line F' extends in the first direction being the direction in which the first line pattern E extends, The second extended line F' has a greater line width than the second line pattern E' and a smaller line width than the second pad G'.

The second pad G' is bent in a direction perpendicular to the direction in which the second extended line F' extends. One side wall of the second pad G' extends long to produce sideward, thereby forming a second protruding portion 125. The second protruding portion 125 is parallel to the second extended line F' while being perpendicular to the direction in which one part of the second extended line F' extends.

The other ends of the first and second line patterns E and E' included in the first and second patterns 122a and 122b, which are opposite to the extended lines F and F' and the pads G and G', may be bent in a direction other than the first direction. For example, the other ends of the first and second line patterns E and E' may be bent in a direction perpendicular to the first direction. As described above, since the other ends of the line patterns E and E' of the first and second patterns 122a and 122b are bent, a bridge pattern is formed between the other ends of the first and second patterns 122a and 122b, and thus occurrence of short between the first and second patterns 122a and 122b may be reduced.

The first and second patterns 122a and 122b have different lengths. In the illustrated embodiments, the first pattern 122a is shorter than the second pattern 122b.

FIGS. 3A through 17B are cross-sectional views and plan views illustrating operations for fabricating the semiconductor device illustrated in FIGS. 1A and 1B, according to some embodiments of the inventive subject matter.

Figure 3A:
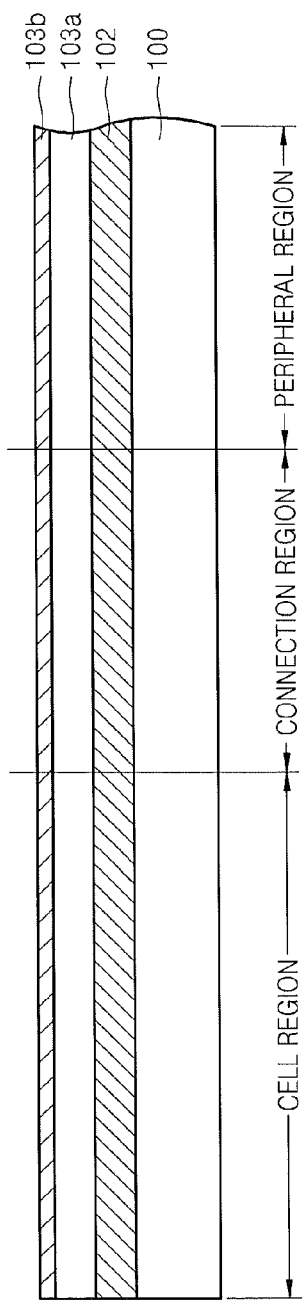
Figure 3B:
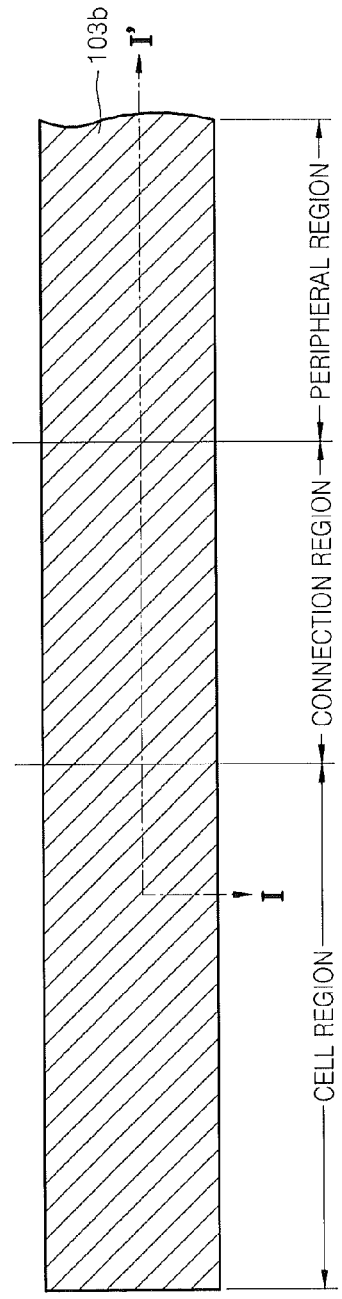
Figure 4A:
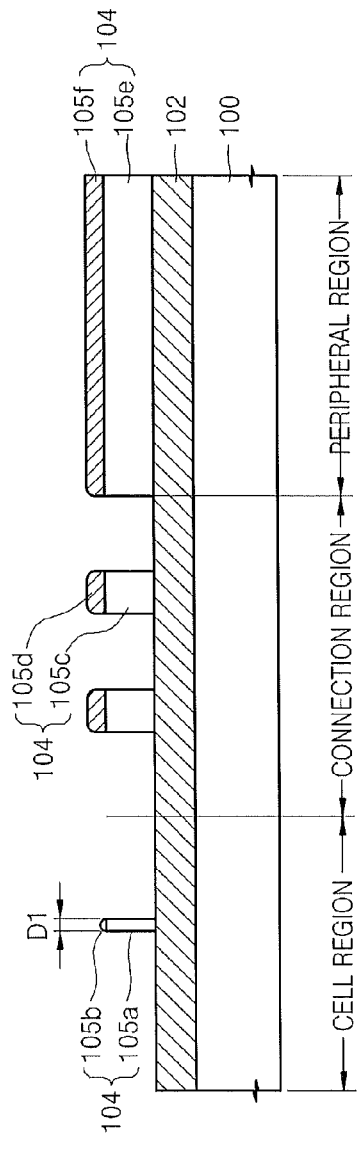

FIGS. 3A, 4A, ..., and 17A are cross-sectional views of the semiconductor device of FIGS. 1A and 1B, and FIGS. 3B, 4B, ..., and 17B are plan views of the semiconductor device of FIGS. 1A and 1B. In particular, FIGS. 3A, 4A, ..., and 17A are cross-sectional views taken along line I-I' of FIGS. 3B, 4B, ..., and 17B. FIG. 4C is an enlarged plan view of a sacrificial pattern structure formed in the cell region and the connection region.

Referring to FIGS. 3A and 3B, an etching target layer 102 is formed on the substrate 100 including the cell region, the connection region, and the peripheral region. The etching target layer 102 may be patterned through a subsequent process, and the patterned etching target layer 102 may be used as a mask pattern for etching an underlayer. For example, the etching target layer 102 may be formed by depositing a silicon oxide. Examples of the silicon oxide may include borophosphosilicate glass (BPSG), tonen silazene (TOSZ), high density plasma (HDP), plasma enhanced tetra-ethyl-orthosilicate (PE-TEOS) glass, and the like.

A sacrificial layer 103 is formed on the etching target layer 102. The sacrificial layer 103 is provided as a buffer layer for forming etch masks having a fine line width and a great line width according to regions. The sacrificial layer 103 may be formed by sequentially depositing a first material layer 103a and a second material layer 103b.

In detail, the first material layer 103a is formed on the etching target layer 102. The first material layer 103a is formed of a polymer material that can be easily removed through ashing and stripping. For example, the first material layer 103a may be formed of a spin-on hard mask (SOH) material or a carbon SOH (C—SOH) material. Since a part of the first material layer 103a is used as an actual etch mask, the first material layer 103a is formed to have a thickness sufficient to be used as an etch mask.

The second material layer 103b is formed on the first material layer 103a. The second material layer 103b may be formed by depositing silicon oxynitride (SiOxNy) or silicon nitride (SiNx). The second material layer 103b is entirely removed before etching the etching target layer 102, without being used as an etch mask. Therefore, the second material layer 103b is formed to have a smaller thickness than the first material layer 103a.

Figure 4B:
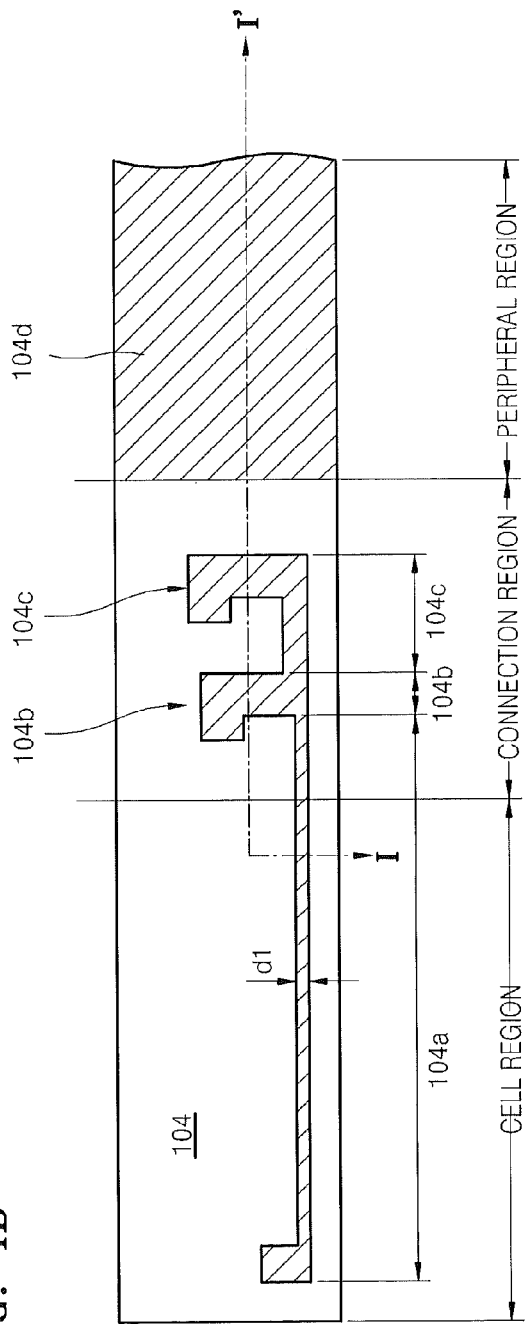
Figure 4C:
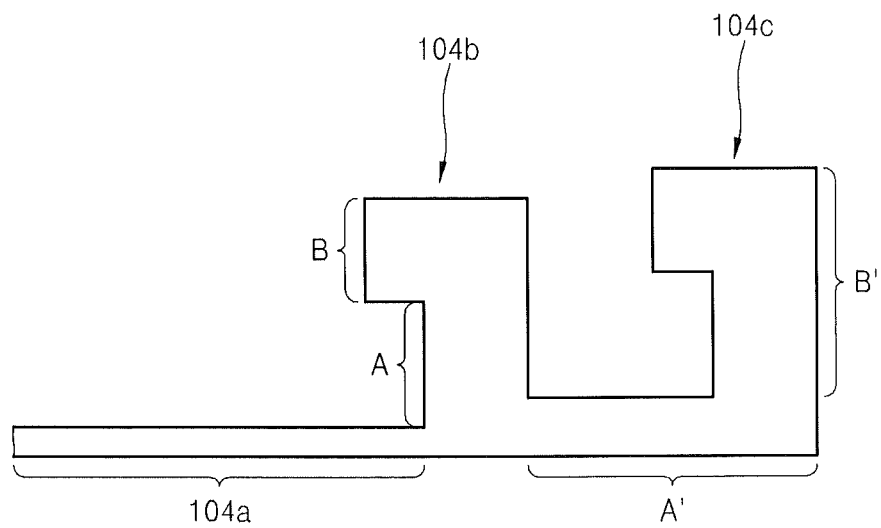

Referring to FIGS. 4A through 4C, a portion of the sacrificial layer 103 that exists in the cell region and the connection region is patterned through photolithography, thereby forming a sacrificial pattern structure 104. As will be described later, two patterns are formed on both sidewalls of a single sacrificial pattern structure 104 through subsequent processes. Therefore, a number of sacrificial pattern structures 104 being ½ of the number of patterns of a pattern structure desired to be formed are formed.

Optionally, a sacrificial layer formed in the peripheral region may not be patterned or may be patterned to have a line width equal to or greater than a predetermined length, in order to prevent pitting from occurring in the peripheral region. Pitting denotes a phenomenon that an upper surface of a first material layer of a sacrificial layer is exposed due to undesired etching of a part of a second material layer of the sacrificial layer and thus a part of the first material layer that should not be etched is etched during subsequent ashing and stripping. Since the first material layer is used as an etch mask of an etching target layer, if the first material layer is formed with an undesired shape due to the pitting phenomenon, a desired pattern is not formed.

Since the shape of an etch mask formed later varies according to the shape of the sacrificial pattern structure 104, the sacrificial pattern structures 104 having different shapes need to be formed according to the shapes of desired pattern structures. As shown in FIGS. 4A through 4C, the sacrificial pattern structure 104 is formed by stacking first material layer patterns 105a, 105c, and 105e and second material layer patterns 105b, 105d, and 105f, respectively, and the second material layer patterns 105b and 105d have different thicknesses according to the line width of the sacrificial pattern structure 104.

Since the shape of an etch mask formed later varies according to the shape of the sacrificial pattern structure 104, the sacrificial pattern structures 104 having different shapes need to be formed according to the shapes of desired pattern structures. For example, since a sacrificial pattern structure in the connection region is to form a pad for electrical connection with a contact plug, the sacrificial pattern structure in the connection region may be formed to have a greater line width than a sacrificial pattern structure in the cell region.

In detail, a first photoresist layer (not shown) is coated on the second material layer 103b and patterned through exposure and developing, thereby forming a first photoresist pattern. In this case, to prevent the pitting phenomenon, a portion of the first photoresist layer formed in the peripheral region may not be patterned or may be patterned to have at least a predetermined line width. The first photoresist pattern may include a part formed in the cell region and having a small line width, and a part formed in the connection region and having a relatively large line width.

The second material layer 103b is etched using the first photoresist pattern as an etch mask. Thereafter, the first material layer 103a is etched using the second material layer as an etch mask, thereby forming the sacrificial pattern structure 104 obtained by stacking the first material layer pattern 105a and 105c and the second material layer patterns 105b and 105d.

When the above etching processes are performed, the second material layer pattern 105b corresponding to the part having a small line width is subject to larger etching damage than the second material layer pattern 105d corresponding to the part having a relatively large line width due to a three-dimensional effect (that is, an etch amount per unit area of a narrow pattern is greater than that of a wide pattern).

In more detail, the first material layers 105a and 105c may be etched under the etching condition that consumption of the second material layer pattern 105b having the small line width in the cell region is greater than that of the second material layer pattern 105d having the large line width in the connection region. Accordingly, after the etching process is performed, the second material layer pattern 105b remains relatively thin in a line portion having the small line width, and the second material layer pattern 105d remains relatively thick in a line portion having the large line width.

In the case of FIGS. 4A through 4C, since a first photoresist layer formed in the peripheral region is not patterned, the first and second material layers 105e and 105f formed in the peripheral region may remain as they are, without being patterned. The second material layer 105f not patterned as described above may prevent pitting from occurring around the second material layer 105f.

The shape of a finally formed pattern structure depends on the shape of the sacrificial pattern structure. Hereinafter, the shape of the sacrificial pattern structure according to the illustrated embodiments will be described.

The sacrificial pattern structure 104 includes a sacrificial line 104a extending in the first direction and having a first line width d1. The sacrificial pattern structure 104 further includes a first sacrificial pad portion 104b that is connected to one end of the sacrificial line 104a in a direction perpendicular to the first direction and that has a greater line width than the first line width d1. The sacrificial pattern structure 104 further includes a second sacrificial pad portion 104c that is connected to one end of the sacrificial line 104a so as to be separated from the first sacrificial pad portion 104b and that has a greater line width than the first line width.

In a subsequent process, two line shapes of etch masks are formed on both sidewalls of the sacrificial line 104a. The line shapes of etch masks are spaced apart from each other by removing the sacrificial line 104a. To reduce the distance between the two etch masks, the sacrificial line 104a may have a line width smaller than the critical line width of photolithography. For example, the sacrificial line 104a may have a line width of about 40 nm to about 60 nm.

In a subsequent process, the first sacrificial pad portion 104b turns into an etch mask pattern of a pad shape connected to one line shape of etch mask pattern (that is, one of the two line shaped etch masks). The second sacrificial pad portion 104c also turns into an etch mask pattern of a pad shape connected to the other line shaped etch mask pattern.

In a part 104d of the sacrificial pattern structure 104 formed in the peripheral region, the first material layer 105e and the second material layer 105f remain extending over the entire peripheral region. This is to prevent the pitting phenomenon, and the part 104d formed in the peripheral region undergoes a special patterning process. The special patterning process will be described later in greater detail with reference to FIGS. 10A and 10B.

As shown in FIG. 4C, the first sacrificial pad portion 104b includes a first preliminary extending portion A extending perpendicularly from one end of the sacrificial line 104a, and a second preliminary extending portion B that is connected to the first preliminary extending portion A and where a pad is actually formed. The second sacrificial pad portion 104c includes a second preliminary extending portion A' extending from one end of the sacrificial line 104a in the same direction as the extending direction of the sacrificial line 104a, and a second preliminary extending portion B' that is connected to the second preliminary extending portion A' and where a pad is actually formed. The first and second preliminary pad portions B and B' need to be formed in sizes similar to desired pad sizes. At least one selected from the group consisting of the first and second preliminary extending portions A and A' is bent perpendicularly to the first direction or at a certain angle with the first direction.

An end of the sacrificial line 104a of the sacrificial pattern structure 104 that is opposite to the sacrificial pad portions 104b and 104c is bent in a direction perpendicular to the first direction. In an example other than this example, although not shown, the end of the sacrificial line 104a may be bent at a certain angle with the first direction.

The line width of the bent part in the sacrificial pattern structure 104 is a distance between two etch masks formed on both sidewalls of the sacrificial line 104a. The ends of the two etch masks may be sufficiently separated from each other without being bridged. Therefore, the line width of the bent part of the sacrificial line 104a may be larger than the first line width d1.

Figure 5A:
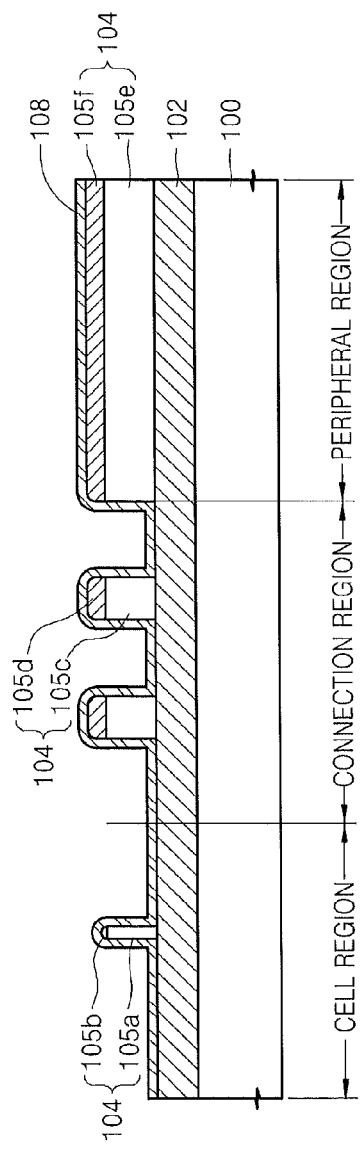
Figure 5B:
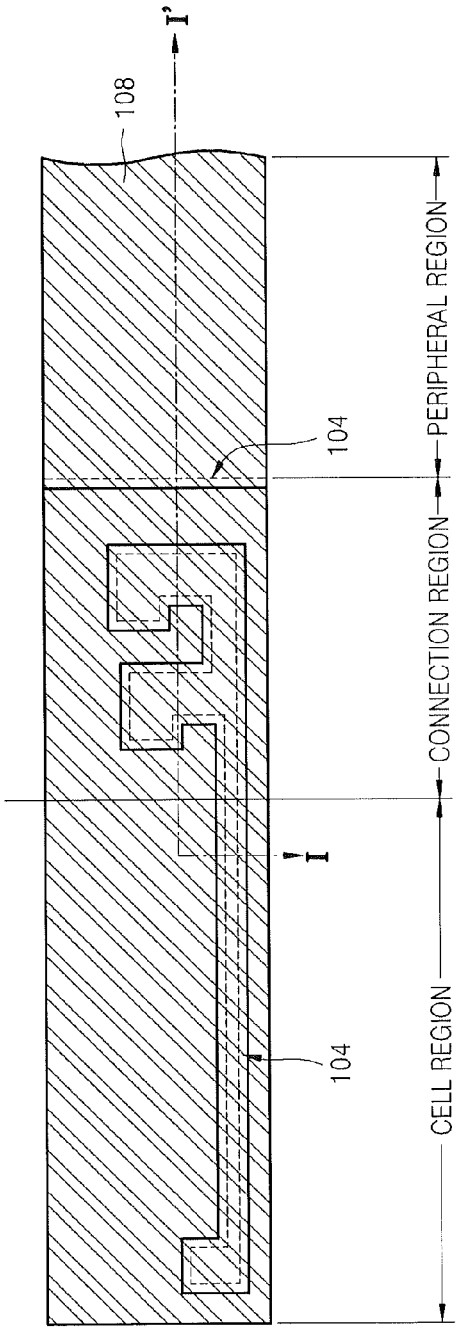

Referring to FIGS. 5A and 5B, a spacer formation layer 108 is formed on a surface of the sacrificial pattern structure 104 and an upper surface of the etching target layer 102. The spacer formation layer 108 may be formed by depositing a silicon oxide. A thickness of the spacer formation layer 108 is equal to the line width of a subsequent etch mask. Therefore, the spacer formation layer 108 is formed to have a thickness equal to the line width of a desired etch mask. The spacer formation layer 108 may have a thickness smaller than a critical line width obtained by photolithography. To this end, the spacer formation layer 108 may be formed by atomic layer deposition.

Referring to FIGS. 6A and 6B, the spacer formation layer 108 is coated with a second photoresist layer (not shown). Next, a second photoresist pattern 110 is formed by photolithography.

The second photoresist pattern 110 includes a first aperture portion 112 that selectively exposes a portion between the first and second sacrificial pad portions 104b and 104c. In detail, a portion bent perpendicularly to the first direction between the first and second sacrificial pad portions 104b and 104c should be exposed. A part of the sacrificial pattern structure 104 and a part of the spacer formation layer 108 are exposed through the first aperture portion 112 of the second photoresist pattern 110. Although not shown in FIG. 6B, as shown in FIG. 6A, the first aperture portion 112 may also be formed on an end of the sacrificial pattern structure 104.

A distance d2 between the sidewall of the first aperture portion 112 of the second photoresist pattern 110 and an outer sidewall of the sacrificial line 104a of FIG. 4C of the sacrificial pattern structure 104 may be at least about 30 nm to about 100 nm. When the sidewall of the first aperture portion 112 comes extremely closer to the outer sidewall of the sacrificial pattern structure 104, trouble may be generated due to misalignment. When the sidewall of the first aperture portion 112 comes extremely farther from the outer sidewall of the sacrificial pattern structure 104, completed fine patterns may be bridged, and thus a short may occur.

The second photoresist pattern 110 exposes a portion of the spacer formation layer 108 located on the outer wall of an end of the sacrificial line 104a that is opposite to the first and second sacrificial pad portions 104b and 104c.

Referring to FIGS. 7A and 7B, a part of the sacrificial pattern structure 104 located in the first aperture portion 112 of FIG. 6B in the cell region and the connection region, and a part of the spacer formation layer 108 on the part are removed. To this end, the exposed spacer formation layer 108 and the sacrificial pattern structure 104 are etched using the second photoresist pattern 110 as an etch mask.

When the etching process is performed, a portion of the spacer formation layer 108 located on the end of the sacrificial line 104a opposite to the first and second sacrificial pad portions 104b and 104c is etched out, and thus an end of the spacer formation layer 108 is divided into two regions.

When the etching process is performed, a second aperture portion 114 is formed between the first and second sacrificial pad portions 104b and 104c of the sacrificial pattern structure 104. At this time, the sidewall of the sacrificial pattern structure 104 is exposed through the second aperture portion 114. On the other hand, since a portion of the sacrificial pattern structure 104 other than the sidewall exposed through the second aperture portion 114 and the end of the sacrificial line 104a is completely covered with the spacer formation layer 108, the portion of the sacrificial pattern structure 104 is not exposed.

Figure 8A:
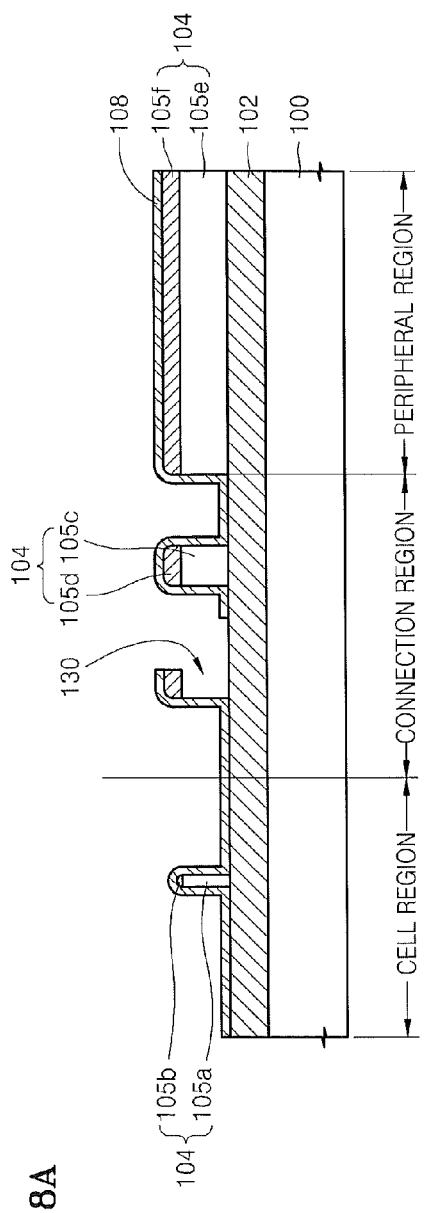
Figure 8B:
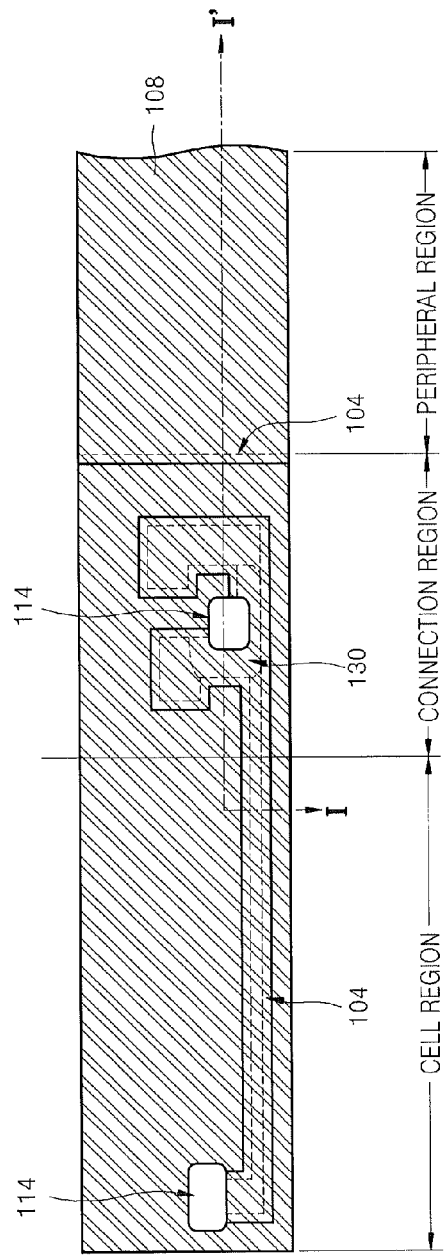

Referring to FIGS. 8A and 8B, the second photoresist pattern 110 is removed. For example, the second photoresist pattern 110 may be removed through ashing and/or stripping.

When the second photoresist pattern 110 is removed, a portion of the first material layer pattern 105a of the sacrificial pattern structure 104 that is exposed at the sidewall of the second aperture portion 114 and on the end of the sacrificial line 104a may also be removed. Since the first material layer pattern 105a is formed of an organic polymer material having etching characteristics similar to those of the second photoresist pattern 110 and the second photoresist pattern 110 is isotropically removed, a part of the first material layer pattern 105a may be also removed while the second photoresist pattern 110 is being removed. Accordingly, while the second photoresist pattern 110 and the first material layer pattern 105a are being removed, a groove 130 is formed in a lower lateral direction of the second aperture portion 114. Thus, a lower portion of the second aperture portion 114 is wider than an upper portion thereof. On the other hand, when the second photoresist pattern 110 is removed, the first material layer patterns 105a, 105c, and 105e covered by the spacer formation layer 108 having etching selectivity remain without being removed.

When the second photoresist pattern 110 is removed, the lower portions of the first and second sacrificial pad portions 104b and 104c need to be separated from each other. Therefore, the portion of the first material layer pattern 105a formed between the first and second sacrificial pad portions 104b and 104c is removed so that parts of the spacer formation layer 108 formed on both sides of the sacrificial line 104a are exposed through a lower sidewall of the second aperture portion 114. In this removing process, lower portions of the preliminary extending portions A and A' of the first and second sacrificial pad portions 104b and 104c are removed, and the preliminary pad portions B and B', where a pad is actually formed, are not removed. When the second photoresist pattern 110 is removed, since the second material layer pattern 105c is not removed, the upper portions of the first and second sacrificial pad portions 104b and 104c are not separated from each other.

Figure 9A:
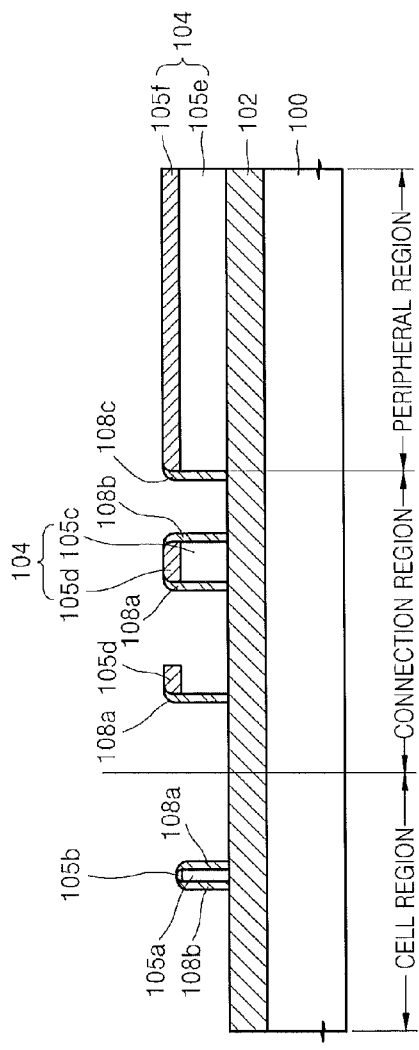
Figure 9B:
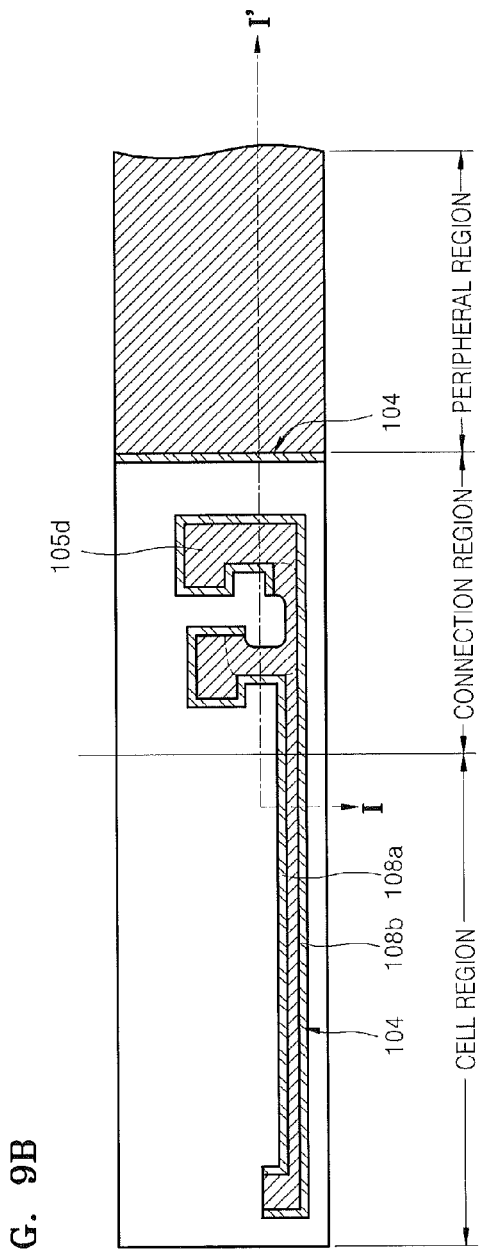

Referring to FIGS. 9A and 9B, the spacer formation layer 108 is anisotropically etched to form first, second, and third spacers 108a, 108b, and 108c on both sidewalls of the sacrificial pattern structure 104.

As shown in FIGS. 9A and 9B, since the spacer formation layer 108 has been removed from the second aperture portion 114, the first and second spacers 108a and 108b are not included in the second aperture portion 114. Accordingly, the two spacers 108a and 108b in which both ends of the spacer 108a are separated from those of the spacer 108b are formed on sidewalls of each sacrificial pattern structure 104. The spacer 108a has a shape surrounding the sidewall of the first sacrificial pad portion 104b, and the spacer 108b has a shape surrounding the sidewall of the second sacrificial pad portion 104c.

Similar to the cell region and the connection region, a portion of the spacer formation layer 108 formed on the not-patterned sacrificial pattern structure 104 in the peripheral region is also anisotropically etched, and thus the third spacer 108c is formed on both sidewalls of the sacrificial pattern structure 104 of the peripheral region. The third spacer 108c has a shape surrounding the sidewalls of the first and second material layers 105e and 105f.

Figure 10A:
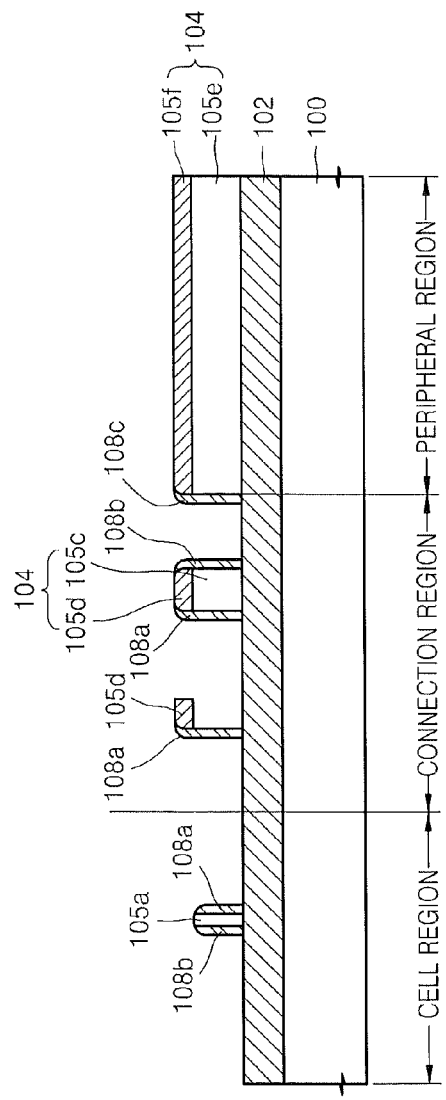
Figure 10B:
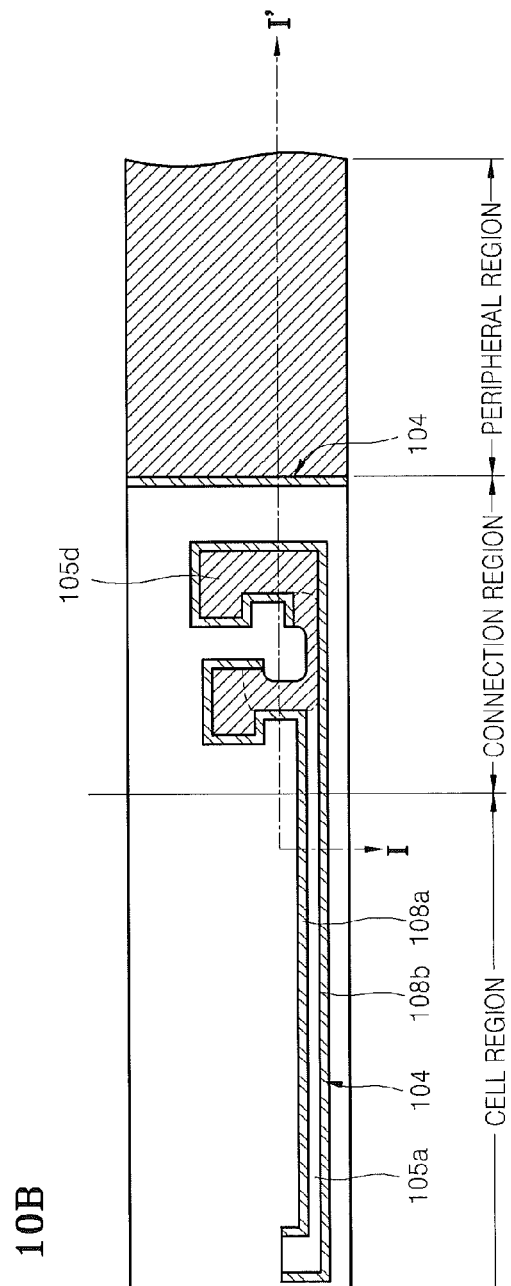

Referring to FIGS. 10A and 10B, while leaving the second material layer pattern 105d included in the first and second sacrificial pad portions 104b and 104c, the second material layer pattern 105b included in the sacrificial line 104a having the first line width is removed. In more detail, the second material layer patterns 105b and 105d may be removed under the etching condition that consumption of the second material layer pattern 105b having the small line width in the cell region is greater than that of the second material layer pattern 105d having the large line width in the connection region. As described above, this etching conduction is based on the 3D effect.

As a result of the process of forming the sacrificial pattern structure 104 shown in FIGS. 4A and 4B, the sacrificial line 104a having the first line width includes the second material layer pattern 105b having a relatively small thickness, and the first and second sacrificial pad portions 104b and 104c includes the second material layer pattern 105d having a relatively large thickness. Therefore, when the second material layer patterns 105b and 105d are etched without a special etch mask by controlling an etch duration, the second material layer pattern 105b included in the sacrificial line 104a may be entirely removed, and the second material layer pattern 105d included in the remaining sacrificial pad portions 104b and 104c may remain.

Since the second material layer 105f formed in the peripheral region is not patterned, the second material layer 105f is relatively slightly removed due to the above-described 3D effect although the second material layer patterns 105b and 105d are etched. Accordingly, the second material layer 105f may continuously maintain a state of covering the first material layer 105e.

When describing the pitting phenomenon in connection with the 3D effect, a pattern having a very small line width, for example, 40 nm or less, like a word line is subject to large etching damage due to the 3D effect. Thus, only a relatively thin second material layer pattern 105b remains as shown in the cell region of FIG. 4A. A pattern having a very large line width, for example, 100 nm or more, like a pad is subject to small etching damage due to the 3D effect. Thus, a relatively thick second material layer pattern 105d remains as shown in the connection region of FIG. 4A.

In a peripheral region where various sorts of driving circuits are implemented, patterns having various sorts of line widths are formed. For example, a pattern to be formed in the peripheral region may require a line width of 40 nm or less like a word line of the cell region, a line width of 100 nm or more like a pad of the connection region, or a line width ranging between 40 nm and 100 nm. In this case, the line width of 40 nm or less and the line width of 100 nm or more may be obtained by applying the same operations to the cell region and the connection region. However, when the line width ranging between 40 nm and 100 nm is implemented, a pattern having the line width ranging between 40 nm and 100 nm is subject to a middle level of etching damage between a strong etching damage (a line width of 40 nm or less)" and a "weak etching damage (a line width of 100 nm or more)" due to the 3D effect shown in FIG. 4A.

When the first material layer 105e and the second material layer 105f formed in the peripheral region are patterned, first and second material layer patterns (not shown) may be formed to have the line width ranging between 40 nm and 100 nm. In this case, only when the second material layer pattern formed on the first material layer pattern entirely remains as it is, the first material layer pattern may not be removed by a subsequent process. However, since the second material layer pattern formed to have the line width ranging between 40 nm and 100 nm is subject to the middle level of etching damage, a part of the upper surface of the first material layer pattern may be exposed by a subsequent double patterning process (for example, an etching process of FIG. 10A). In this case, the pitting phenomenon in which an upper portion of a first material layer is exposed due to undesired etching of a part of a second material layer and thus a part of the first material layer that should not be etched is etched may occur.

Accordingly, the technical spirit of the inventive subject matter includes execution of a special patterning process (refer to FIG. 15A) after formation of a fine pattern due to a future double patterning process without patterning a pattern structure formed in a peripheral region (refer to FIG. 4A). Accordingly, the first material layer 105e of FIG. 4A and the second material layer 105f of FIG. 4A remain extending over the entire peripheral region, and since the first and second material layers 105e and 105f have very large line widths, the pitting phenomenon caused by a double pattern process may not occur.

Figure 11A:
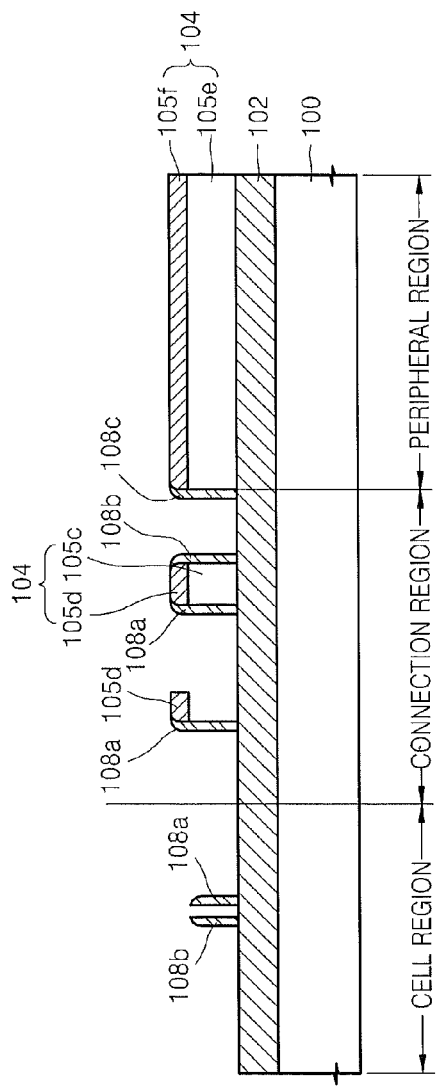
Figure 11B:
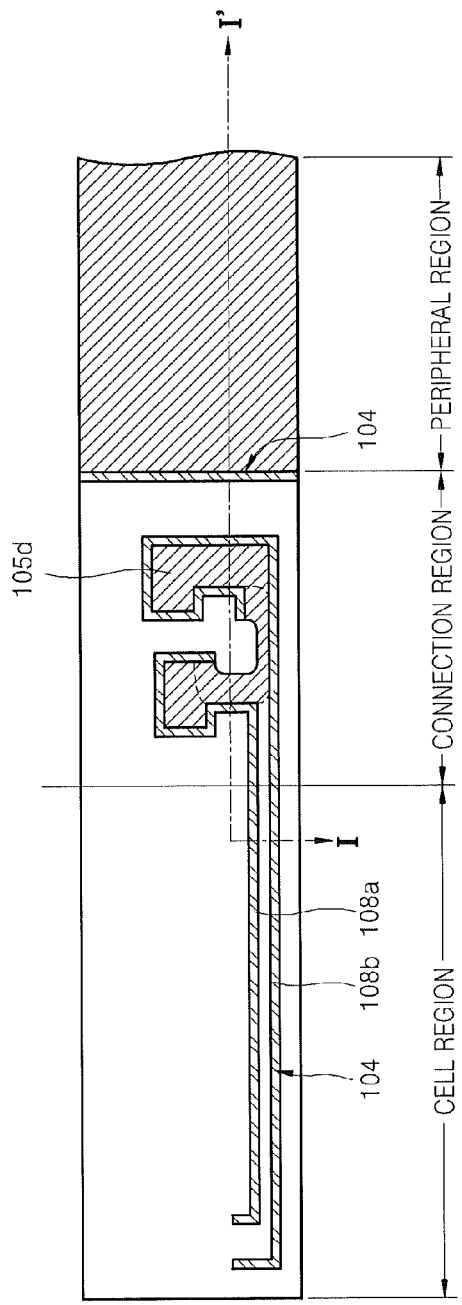

Referring to FIGS. 11A and 11B, the exposed first photoresist pattern 105a is removed. Since the first material layer pattern 105c is not exposed in a region where the second material layer pattern 105d remains, the first material layer pattern 105c is not removed. Since the first material layer 105e is not exposed in the peripheral region where the second material layer 105f is formed, the first material layer 105e is not removed.

The first material layer pattern 105a may be removed through anisotropic etching. Accordingly, a gap is generated between the first and second spacers 108a and 108b while the first material layer pattern 105a located in the sacrificial line 104a having the first line width is being removed. On the other hand, the first material layer pattern 105c included in the first and second sacrificial pad portions 104b and 104c remains as it is.

In detail, as shown in FIG. 11A, since only the second material layer pattern 105 remains as a portion corresponding to the preliminary extending portions A and A' of the first and second sacrificial pad portions 104b and 104c, lower portions of the first and second sacrificial pad portions 104b and 104c are substantially separated from each other. The portion corresponding to the preliminary extending portions A and A' of the first and second sacrificial pad portions 104b and 104c is a stack of the first and second material layer patterns 105c and 105d, and the first and second spacers 108a and 108b surrounding the sidewalls of the preliminary pad portions B and B' also remain.

Figure 12A:
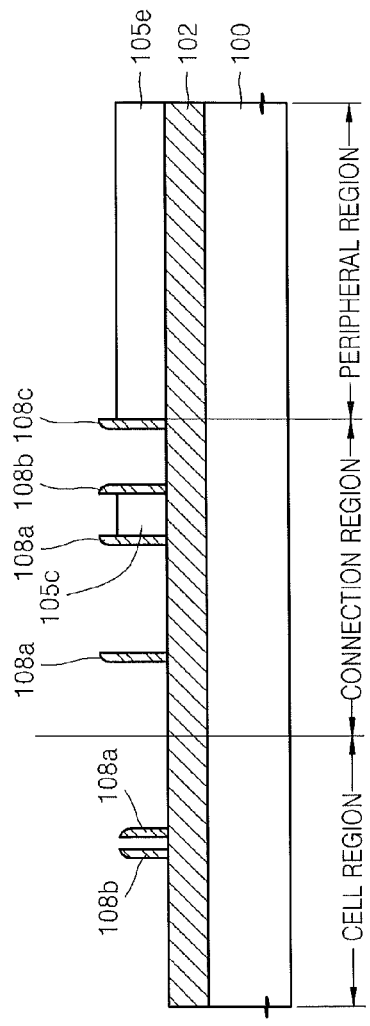
Figure 12B:
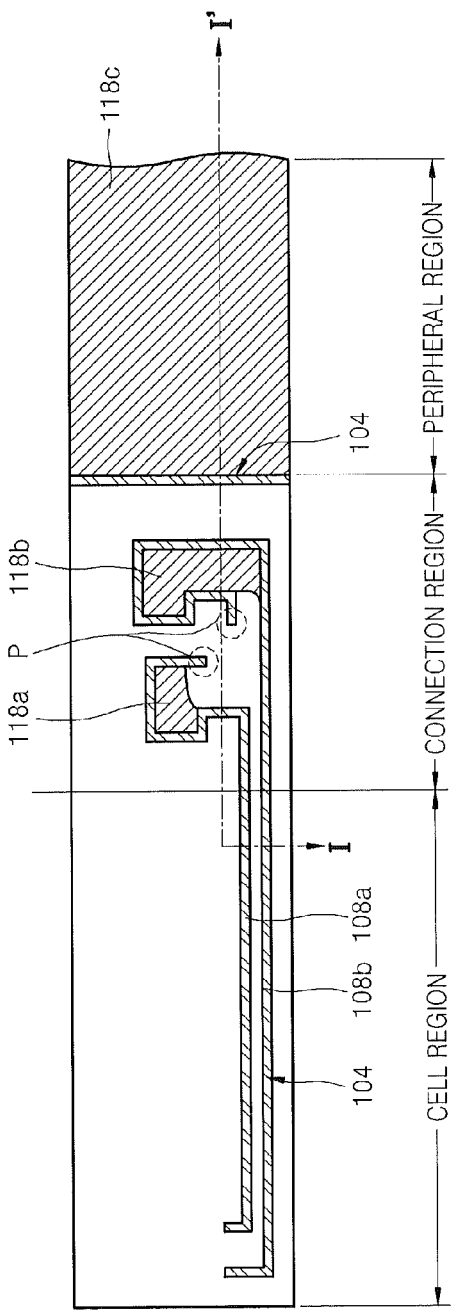

Referring to FIGS. 12A and 12B, the remaining second photoresist patterns 105d and 105f are entirely removed. When the second material layer patterns 105d and 105f are completely removed, an etch mask pattern for etching the etching target layer 102 on the substrate 100 is completed.

In the cell region, the etch mask pattern includes the first and second spacers 108a and 108b. In the cell region, since the first material layer pattern 105a of FIG. 10A formed between the first and second spacers 108a and 108b has been removed, a portion of the upper surface of the etching target layer 102 existing between the first and second spacers 108a and 108b is exposed.

In the connection region, the etch mask pattern includes the first and second spacers 108a and 108b, and first and second pad mask patterns 118a and 118b contacting respective one ends of the first and second spacers 108a and 108b, respectively. The first and second pad mask patterns 118a and 118b correspond to the first material layer 105c remaining in the connection region.

Similarly, in the peripheral region, the etch mask pattern includes a third spacer 108c and a bulk mask 118c contacting an end of the third spacer 108c. The first and second pad mask patterns 118a and 118b and the bulk mask 118c may be formed of the first material layers 105c and 105e.

The etch mask pattern of the illustrated embodiments has the following shape.

In the cell region, the first and second spacers 108a and 108b having fine line widths have line shapes and are parallel to each other. The first and second spacers 108a and 108b are spaced apart from each other by a very short distance.

In the connection region, the etch mask pattern may include the remaining first material layer pattern 105c and the first and second spacers 108a and 108b that surround the first material layer pattern 105c. Accordingly, the etch mask pattern includes the first and second pad mask patterns 118a and 118b that are provided to serve as a place where a pad is formed. As shown in FIG. 12B, the first spacer 108a surrounds the sidewall of the first pad mask pattern 118a and has a protruding portion P protruding from one side of the first pad mask pattern 118a. The second spacer 108b surrounds the sidewall of the second pad mask pattern 118b and has a protruding portion P protruding from one side of the second pad mask pattern 118b.

The protruding portions P of the spacers 108a and 108b in the connection region are obtained by not removing the first and second spacers 108a and 108b exposed through the second aperture portion 114 but partially removing first material layer patterns 105a adjacent to the exposed first and second spacers 108a and 108b in the process of removing the second photoresist pattern 110. In other words, the first and second spacers 108a and 108b protrude sideward by a depth to which the first material layer pattern 105a has been removed.

In the peripheral region, the etch mask pattern includes the bulk mask 118c which is formed of the remaining first material layer 105e and is provided to serve as a place where a driving circuit is formed. As described above, the bulk mask 118c is not patterned to prevent the pitting phenomenon, and may be formed in a pattern having various line widths through a special patterning process.

Figure 13A:
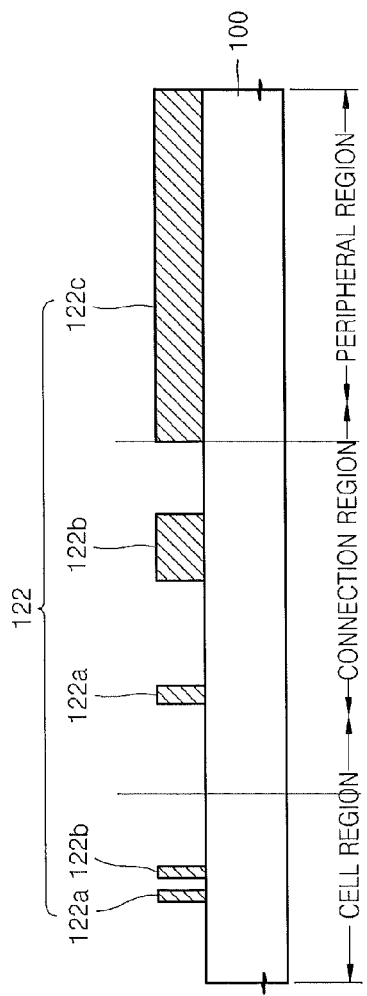
Figure 13B:
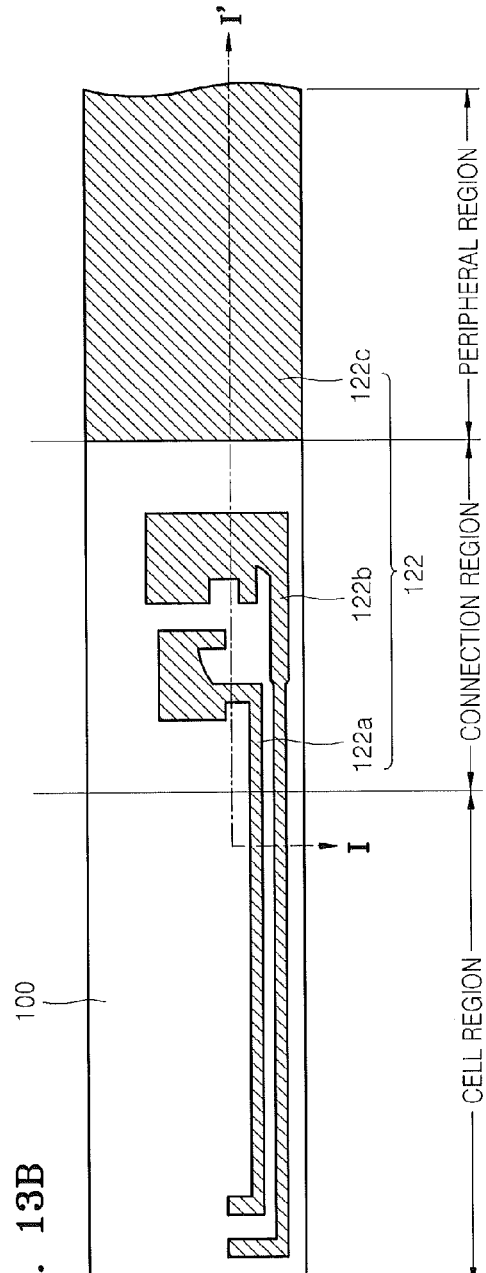

Referring to FIGS. 13A and 13B, a desired pattern structure 122 is formed by etching the etching target layer 102 by using the etch mask pattern. In the cell region, the pattern structure 122 includes first and second patterns 122a and 122b parallel to each other. In the peripheral region, the pattern structure 122 includes a third pattern 122c.

The third pattern 122c in the peripheral region is formed by masking using the third spacer 108c of FIG. 12 and the bulk mask 118c of FIG. 12, and corresponds to a substantially not-patterned bulk pattern. Accordingly, the pitting phenomenon is prevent from occurring due to the double patterning process, and the third pattern 122c may be formed into patterns having various line widths through a special process.

When the processes described above with reference to FIGS. 8A through 13B are performed, only etching of films is continuously conducted without performing photolithography. Therefore, the processes described above with reference to FIGS. 8A through 13B may be conducted in-situ.

As described above, non-execution of complicated photolithography may reduce the cost for a process, and execution of etching processes in-situ may greatly reduce the processing time and reduce process failures.

Figure 14A:
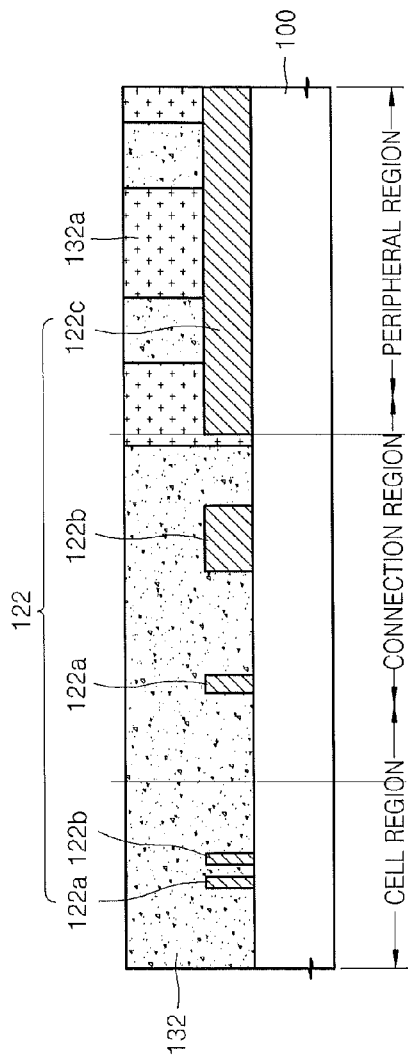
Figure 14B:
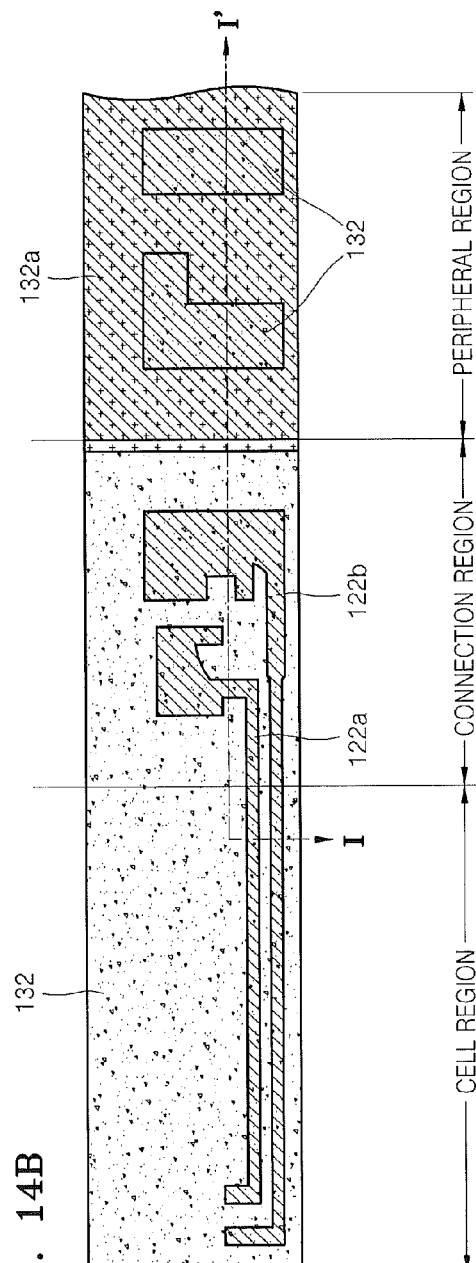

Referring to FIGS. 14A and 14B, a third photoresist layer 132 is formed on the pattern structure 122 being an etching target layer. Then, photolithography is performed on the third photoresist layer 132 to pattern the third photoresist layer 132. Due to exposure, the film of a portion 132a of the third photoresist layer 132 may be changed (for example, changed to alkali fusibility).

As described above, a circuit pattern 170 of FIG. 17B in the peripheral region is formed using a special patterning process in order to prevent the pitting phenomenon, and the third photoresist layer 132 is formed to perform the special patterning process. Accordingly, only a portion of the third photoresist layer 132 that is formed in the peripheral region is a target of the photolithography, and a portion of the third photoresist layer 132 that is formed in the cell region and the connection region may not be a target of the photolithography.

Figure 15A:
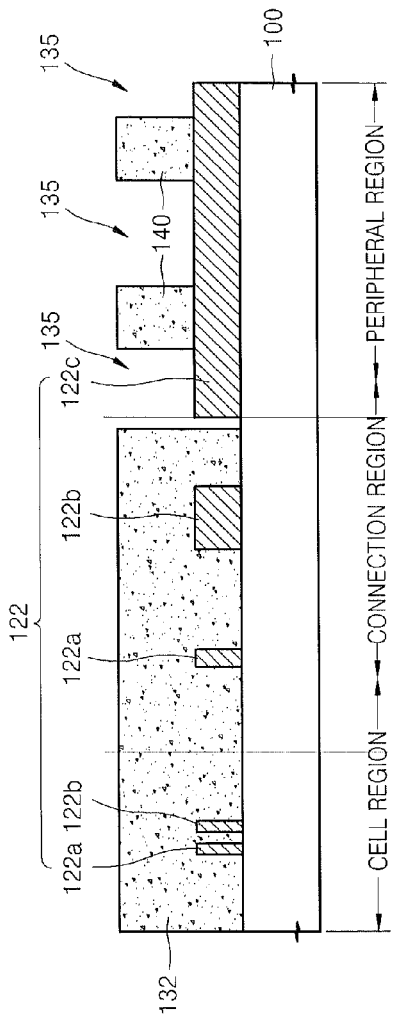
Figure 15B:
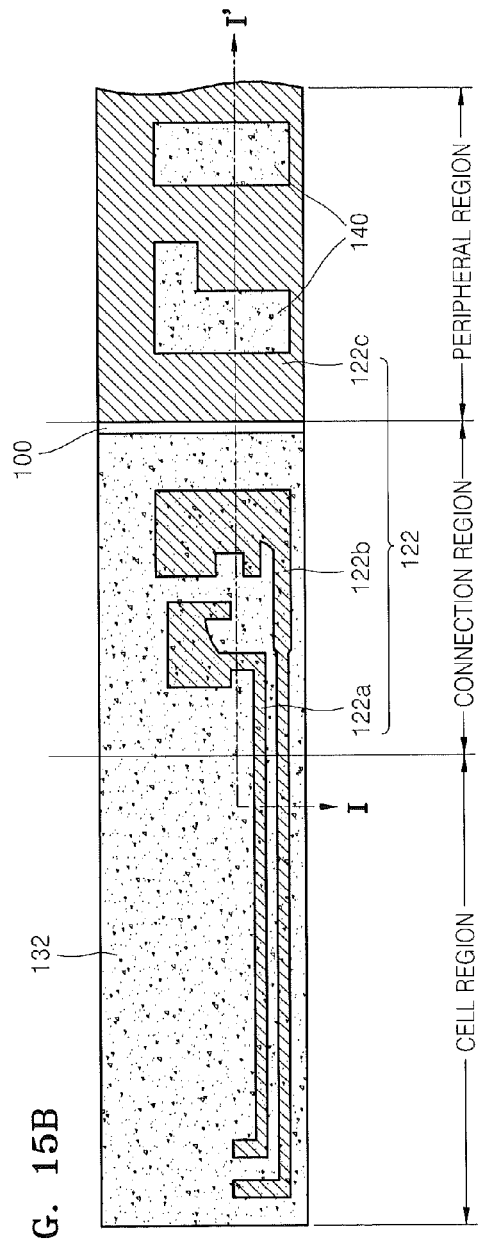

Referring to FIGS. 15A and 15B, a third photoresist pattern 140 is formed by removing the portion 132a of FIG. 14A of the third photoresist layer 132, whose film is weak. A third aperture portion 135 exposing a part of the upper surface of the third pattern 122c being an etching target layer is formed by the third photoresist pattern 140.

As described above, the third photoresist pattern 140 may be formed only on the peripheral region, and a photoresist layer on the cell region and the connection region may not be patterned. However, the inventive subject matter is not limited thereto, and the photoresist layer on the cell region may be patterned to form a gate line of selection transistors SSL and GSL of FIG. 26. The above-described embodiment will be described later in greater detail with reference to FIGS. 27A through 29B.

Figure 16A:
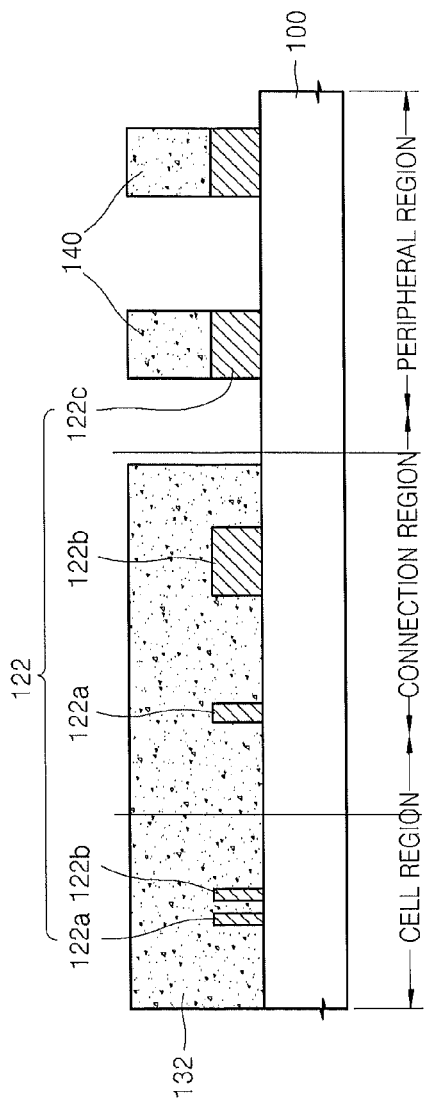
Figure 16B:
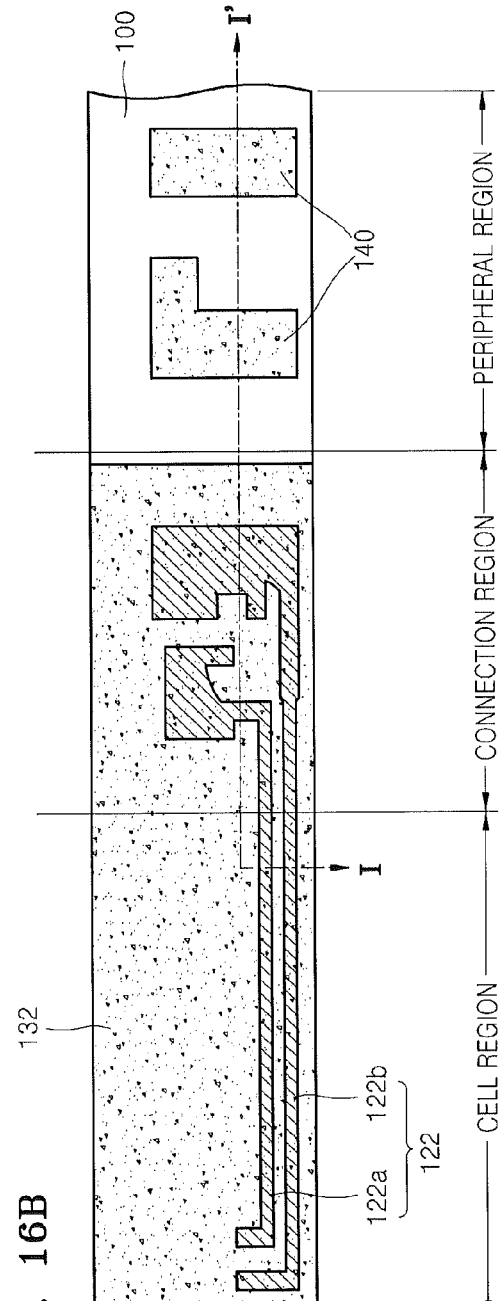

Referring to FIGS. 16A and 16B, a portion of the third pattern 122c exposed through the third aperture portion 135 is etched using the third photoresist pattern 140 as an etch mask. The third pattern 122c being a bulky pattern is divided into a plurality of patterns 170a and 170b of FIGS. 17A and 17B via the etching process.

Figure 17A:
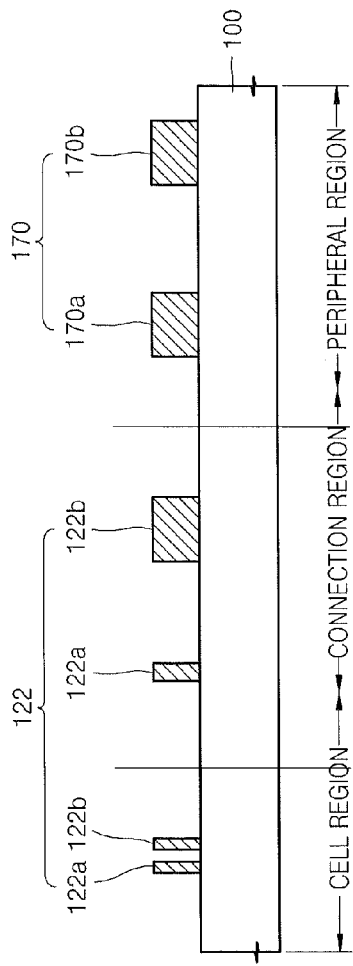
Figure 17B:
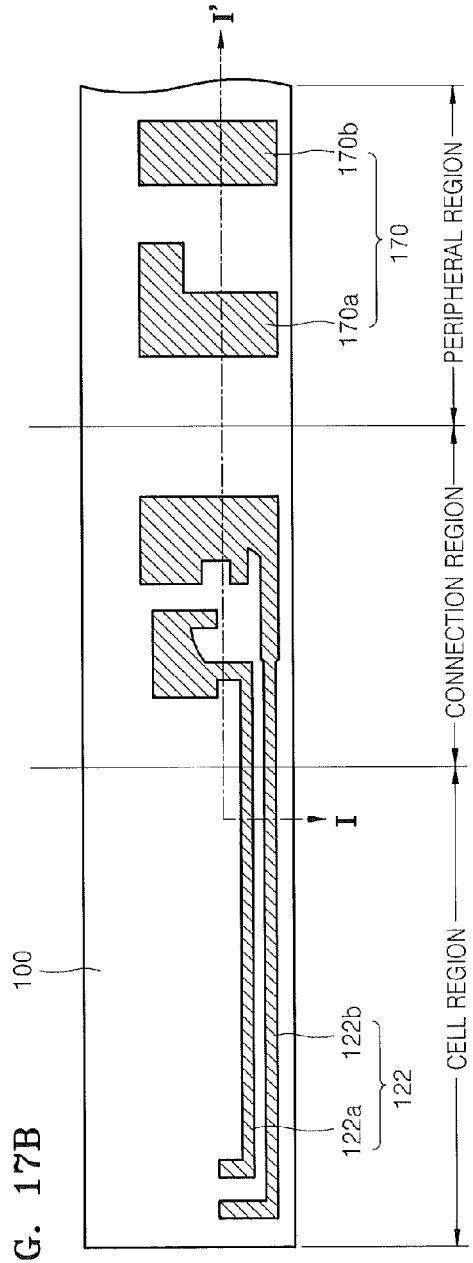

Referring to FIGS. 17A and 17B in which the third photoresist pattern 140 has been removed after the division of the third pattern 122c, a first structure 160 is formed on the cell region and the connection region, and a second structure 170 is formed on the peripheral region. The first structure 160 may include the first pattern 122a and the second pattern 122b, and the second structure 170 may include the patterns 170a and 170b.

According to some embodiments of the inventive subject matter, a pattern structure that includes a pad having a relatively large width at an end thereof and has a fine line width may be formed. In particular, since the line pattern and the pad are not formed through respective patterning processes, misalignment between the line pattern and the pad may not occur.

Moreover, according to the technical spirit of the inventive subject matter, circuit patterns formed on the peripheral region may be prevented from being damaged due to the pitting phenomenon. In other words, an etching target layer of a peripheral region is patterned through special photolithography without being patterned during the double patterning process, so that patterns having line widths that are subject to the middle level of etching damage may be prevented from being subject to pitting damage.

FIGS. 18 through 22B are cross-sectional views illustrating operations for fabricating semiconductor devices according to further embodiments of the inventive subject matter. The fabrication operations according to the illustrated embodiments are a partial modification of the operations shown in FIGS. 3A through 17B. Duplicated descriptions between embodiments will be omitted in light of the prior description.

Referring to FIG. 18, a substrate 100 may include a structure obtained by sequentially stacking a semiconductor substrate 50, an isolation layer 55, a tunneling isolation layer 60, a charge storing layer 70, a blocking insulation layer 80, and a gate conductive layer 90.

The semiconductor substrate 50 may include one selected from the group consisting of silicon-on-insulator, silicon-on-sapphire, germanium, silicon-germanium, and gallium-arsenide. An active region A of the semiconductor substrate 50 may be defined by the isolation layer 55.

The tunneling isolation layer 60 may be a stack of a plurality of layers formed of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), zirconium oxide ($ZrO_2$), or a combination of two or more of these materials.

The charge storing layer 70, which stores data of a nonvolatile memory device, is formed on the tunneling isolation layer 60. In a charge trap flash device, the charge storing layer 70 may include a silicon nitride layer. In a floating gate device, the charge storing layer 70 may include impurity-doped polysilicon.

The blocking insulation layer 80 is formed on the charge storing layer 70 to prevent the charge stored in the charge storing layer 70 from leaking to the gate conductive layer 90. The blocking insulation layer 80 may include a structure obtained by sequentially stacking a lower dielectric layer, a high-dielectric layer, and an upper dielectric layer. A blocking insulation layer formed in the peripheral region may include a butting contact hole 85 formed therein.

The gate conductive layer 90 may be formed on the blocking insulation layer 80. The gate conductive layer 80 may include impurity-doped polysilicon, metal, metal silicide, or a combination of two or more of these materials. In a floating gate type flash memory, a portion of the gate conductive layer 90 formed in the peripheral region may be formed to fill the inside of the butting contact hole 85, so that the gate conductive layer 90 and the charge storing layer 70 may be electrically connected to each other.

The process of forming the semiconductor substrate 50, the tunneling isolation layer 60, the charge storing layer 70, the isolation layer 55, and the blocking insulation layer 80 according to the illustrated embodiments will now be described in greater detail with reference to FIGS. 23 and 24.

Figure 23:
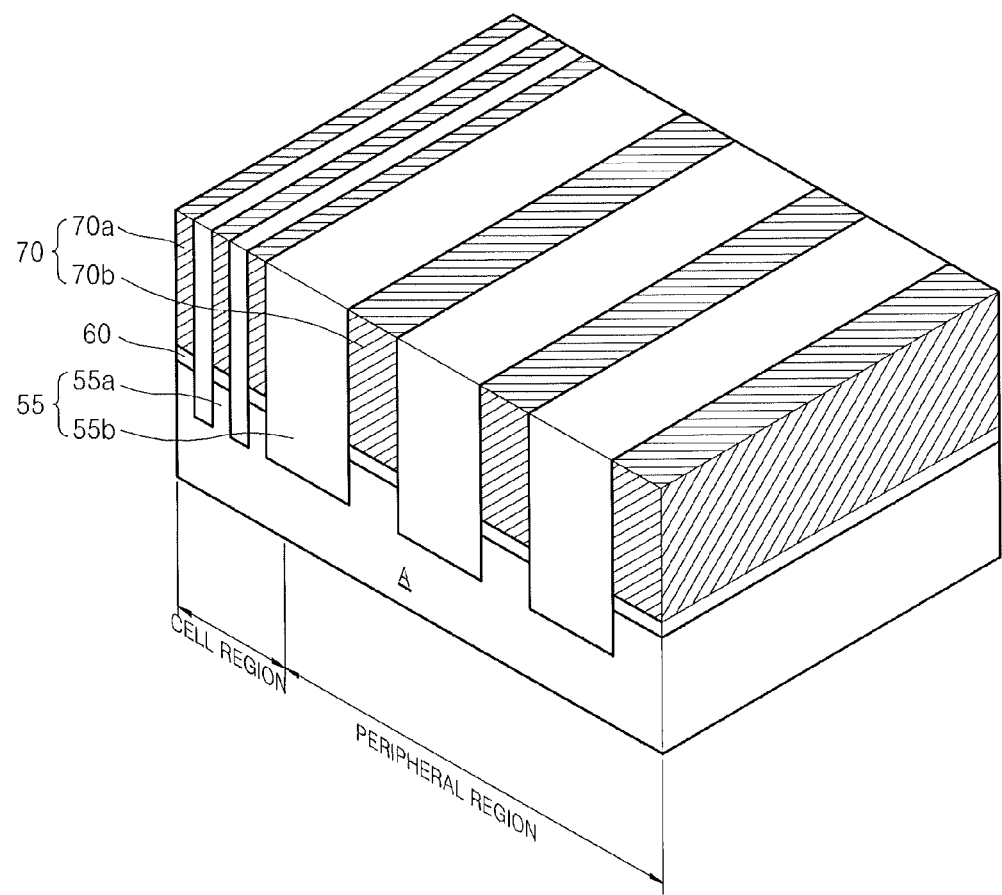
FIGS. 23 and 24 are perspective views illustrating operations for forming a substrate in a semiconductor device, according to some embodiments of the inventive subject matter.

Referring to FIG. 23, the tunneling isolation layer 60 and the charge storing layer 70 are sequentially formed on the semiconductor substrate 50, and the charge storing layer 70, the tunneling isolation layer 60, and the semiconductor substrate 50 are patterned to form a trench. Thereafter, an insulation layer is formed to completely fill the inside of the trench, and is planarized to form the isolation layer 55. The planarization may be performed through chemical mechanical polishing (CMP), etch back techniques, or a combination of the CMP and etch back techniques.

An active region and an isolation layer 55a formed in the cell region may be very dense, whereas an active region and an isolation layer 55b formed in the peripheral region may be sparse. Accordingly, the pattern density of the isolation layer 55a formed in the cell region may be greater than the pattern density of the isolation layer 55b formed in the peripheral region.

Figure 24:
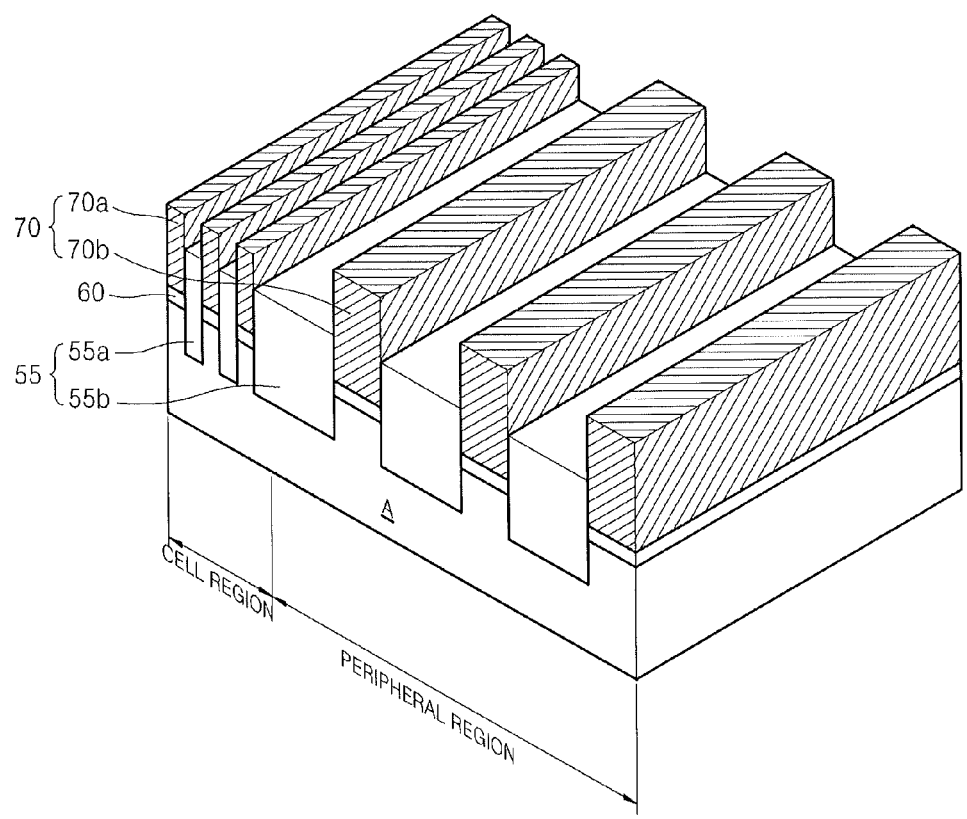

Thereafter, referring to FIG. 24, a recess is formed by etching the isolation layer 55, in order to form a blocking insulation layer (not shown) so as to surround the side surface of the charge storing layer 70a in the cell region. The etching process may be performed under an etching condition in which consumption of the charge storing layer 70 is greater than consumption of the isolation layer 55. In this case, due to the above-described 3D effect (that is, an etching amount per unit area of a narrow pattern is greater than an etching amount per unit area of a wide pattern), the charge storing layer 70a formed in the cell region is more etched than the charge storing layer 70b formed in the peripheral region. Accordingly, a step difference (that is, a height difference) between the charge storing layer 70b formed in the peripheral region and the charge storing layer 70a formed in the cell region may be generated.

The charge storing layer 70 of FIG. 18 does not have the step difference illustrated in FIG. 24, but this provides simple illustration of a process. Accordingly, portions of the charge storing layer 70 of FIG. 18 formed in the cell region and the peripheral region may have different heights.

Referring back to FIG. 18, an etching target layer formed on the substrate 100 including the semiconductor substrate 50, the isolation layer 55, the tunneling isolation layer 60, the charge storing layer 70, the blocking insulation layer 80, and the gate conductive layer 90 undergoes the double patterning process described above with reference to FIGS. 3A through 13B. Due to the double patterning process, the first pattern 122a and the second pattern 122b are formed in the cell region and the third pattern 122c is formed in the peripheral region.

As described above, the third pattern 122c not patterned through the double patterning process substantially corresponds to a bulky pattern. To prevent the pitting phenomenon, the third pattern 122c is patterned by a special patterning process which will be described later.

Figure 19:
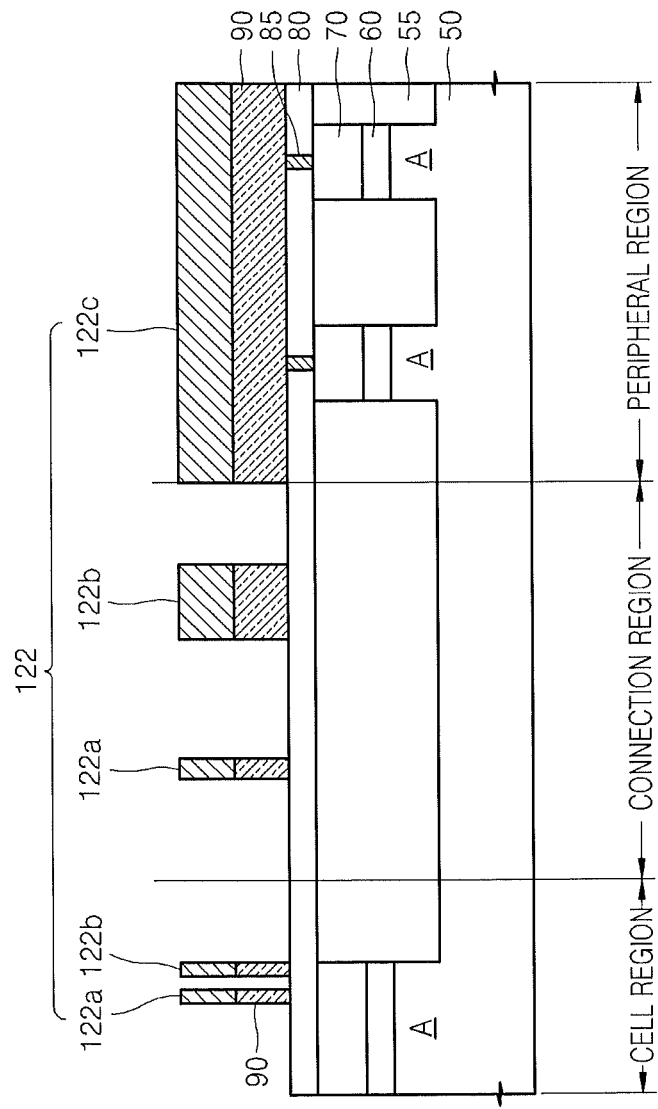

Referring to FIG. 19, the gate conductive layer 90 is etched using the first pattern 122a, the second pattern 122b, and the third pattern 122c as an etch mask. The upper surface of the blocking insulation layer 80 is exposed in a space formed in the gate conductive layer 90 through the etching process.

Figure 20:
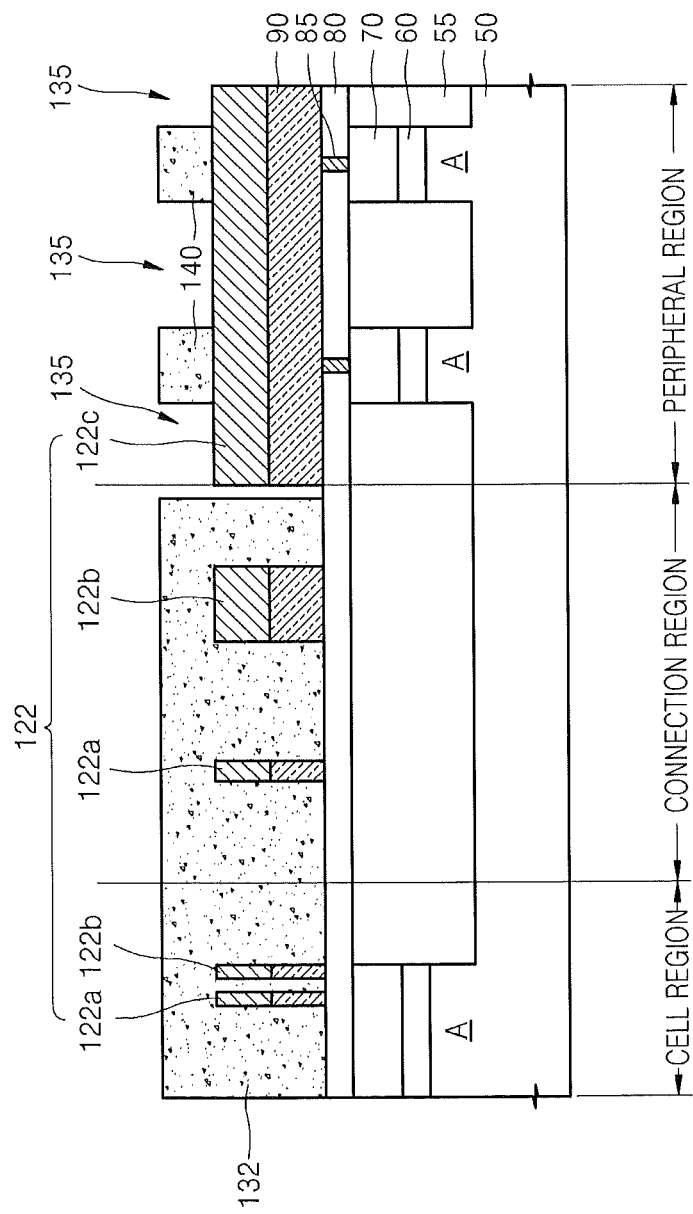

Referring to FIG. 20, the third photoresist layer 132 is formed to cover the blocking insulation layer 80, the gate conductive layer 90, and the first, second, and third patterns 122a, 122b, and 122c, and is patterned to form the third photoresist pattern 140.

As described above, a special patterning process may be performed using the third photoresist pattern 140 in order to prevent circuit patterns of the peripheral region having a line width that is subject to the middle level of etching damage during the double patterning process from being subject to pitting damage. Accordingly, while the third photoresist pattern 140 is being formed, only a portion of the third photoresist layer existing on the peripheral region may be patterned, and the photoresist layer 132 formed on the cell region and the connection region may not be patterned.

Figure 21:
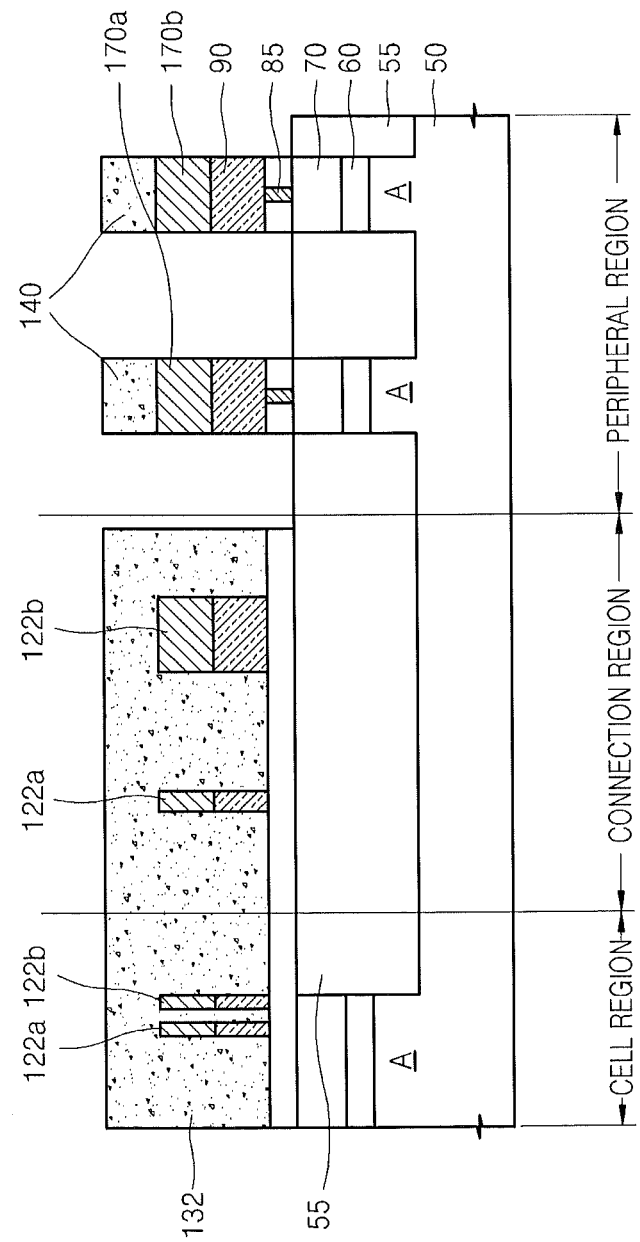

Referring to FIG. 21, the exposed third pattern 122c and the gate conductive layer 90 are etched using the third photoresist pattern 140 as an etch mask. Due to the etching process, the third pattern 122c may be divided into the patterns 170a and 170b. Optionally, as illustrated in FIG. 21, the blocking insulation layer 80 may be further etched during the etching process.

As described above, a portion of the blocking insulation layer 80 formed on the peripheral region is etched first although the blocking insulation layer 80 remains on the cell region, because a step difference exists between the charge storing layers 70a and 70b of FIG. 24 of the cell region and the peripheral region as described above with reference to FIGS. 23 and 24. In other words, due to a pattern density difference (see FIG. 24) between the charge storing layers 70a and 70b of FIG. 24 formed in the cell region and the peripheral region, the height of the charge storing layer 70b of FIG. 24 formed in the peripheral region may be greater than that of the charge storing layer 70a of FIG. 24 formed in the cell region.

In a situation where this height difference exists, when both portions of the charge storing layer 70 in the cell region and the peripheral region undergo the same etching process, a portion of a charge storing layer existing in the cell region may be completely etched, but a portion of the charge storing layer existing in the peripheral region may not be completely etched. When a charge storing layer is not completely etched and a portion of the charge storing layer remains, a problem such as formation of a stringer may occur between the etched charge storing layer patterns.

Accordingly, as shown in FIG. 21, not only the third pattern 122c and the gate conductive layer 90 but also the blocking insulation layer 80 may be etched during the etching process. In this case, although the same etching process is performed on both the cell region and the peripheral region later, the charge storing layer of greater height in the peripheral region may be completely etched while the blocking insulation layer in the cell region is being etched. Accordingly, although a step difference exists between the cell region and the peripheral region, the charge storing layer in the peripheral region may be completely etched out.

Figure 22B:
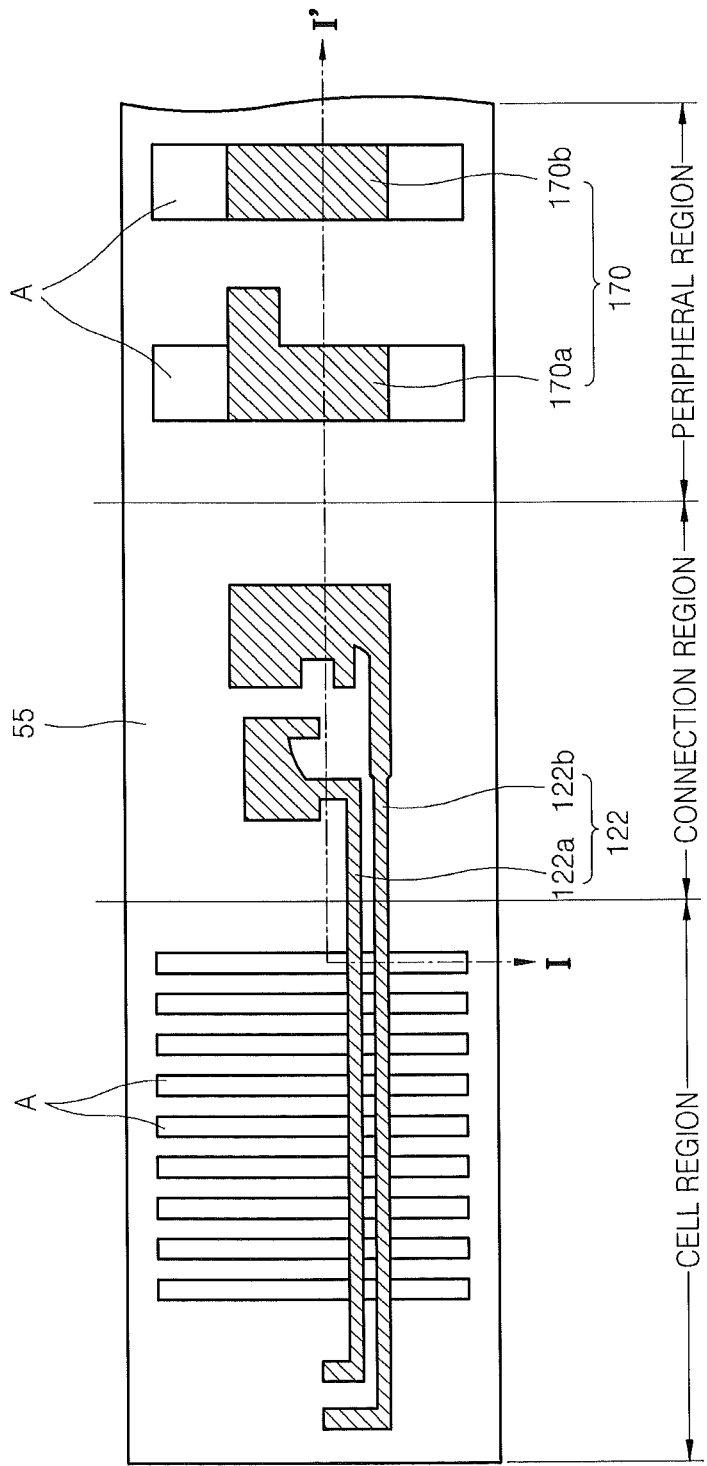

Referring to FIGS. 22A and 22B, the blocking insulation layer 80, the charge storing layer 70, and the tunneling isolation layer 60 on the active region A may be sequentially etched using, as an etch mask, the pattern structure 122 including the first pattern 122a, the second pattern 122b, and the third pattern 122c that remain after removing the third photoresist layer 132 and the third photoresist pattern 140. In this case, parts of the blocking insulation layer 80 and the isolation layer 55 may be etched on the isolation layer 55. As described above, the blocking insulation layer 80 may be etched only on the cell region, and the charge storing layer 70 of the peripheral region having a relatively large height is etched while the blocking insulation layer 80 of the cell region is being etched, whereby the parts of the charge storing layer 70 in the cell region and the peripheral region may be both completely etched.

Figure 25:
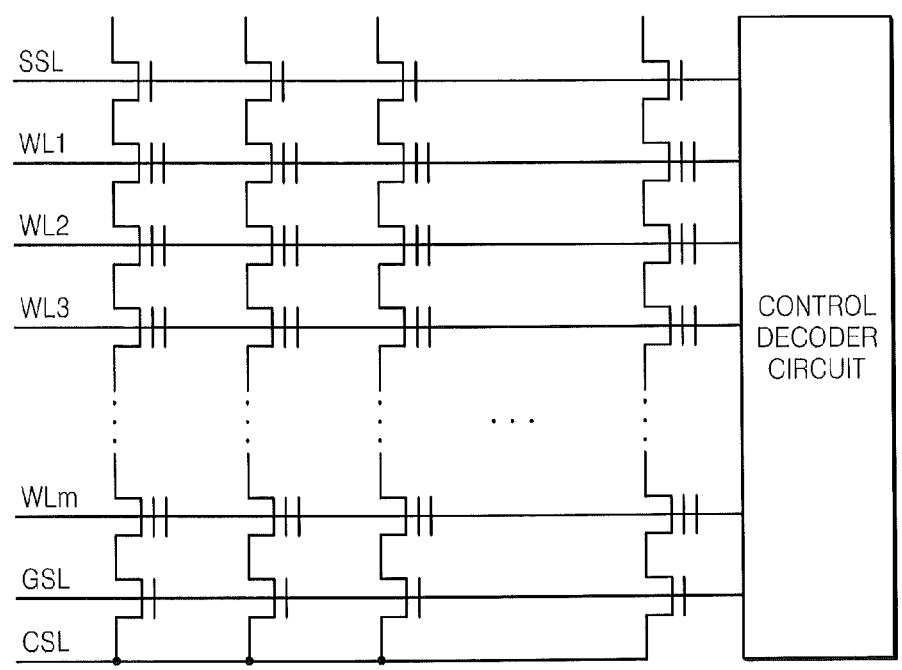
FIG. 25 is a circuit diagram of a cell of a NAND flash memory device.
Figure 26:
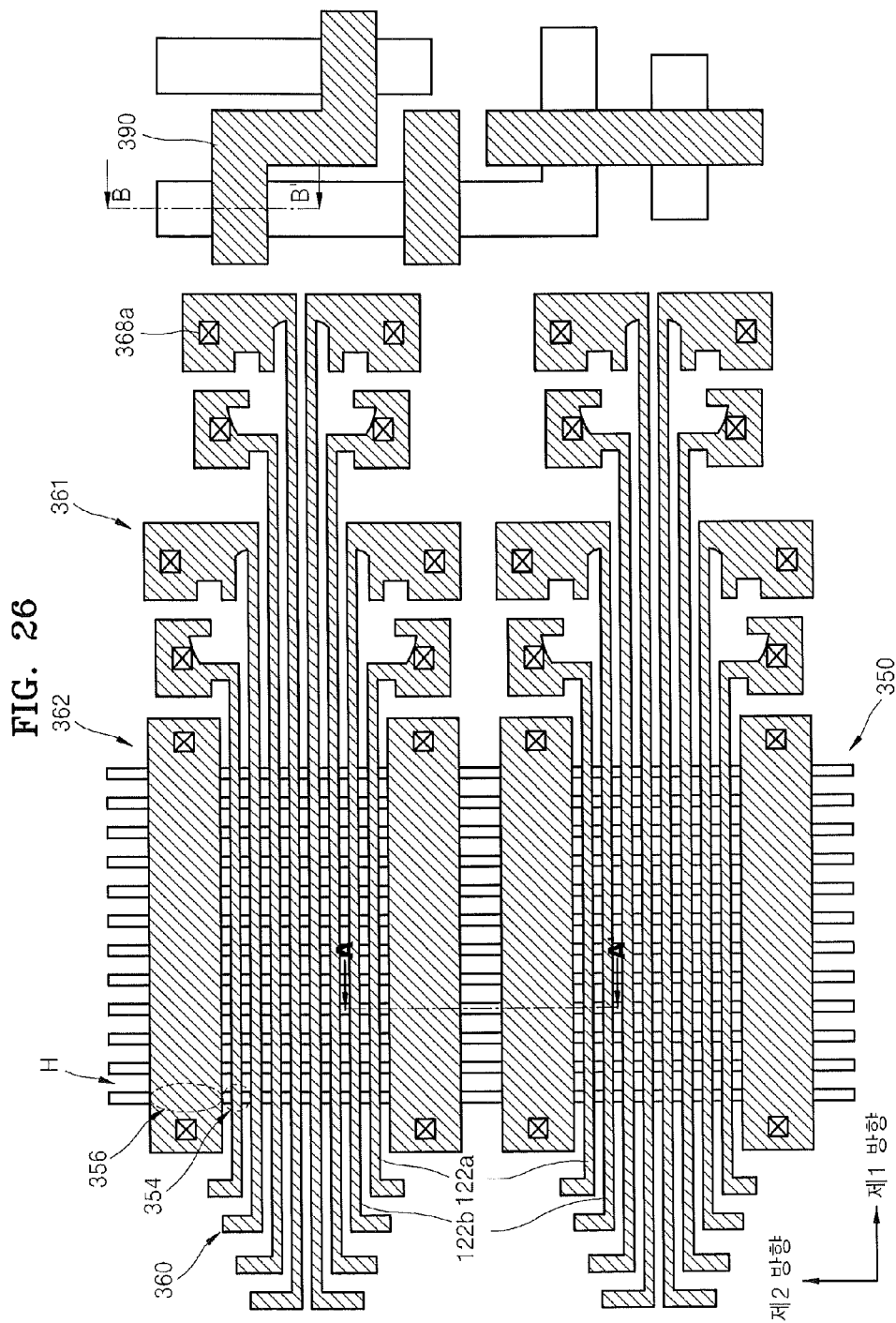
FIG. 26 is a plan view of a cell of a NAND flash memory device including a pattern structure of the semiconductor device illustrated in FIGS. 1A and 1B.

FIG. 25 is a circuit diagram of a cell of a NAND flash memory device. FIG. 26 is a plan view of a cell of a NAND flash memory device including the pattern structure of the semiconductor device illustrated in FIGS. 1A and 1B.

Referring to FIG. 25, a cell region of a substrate includes cells of the NAND flash memory device.

As shown in FIG. 25, each cell string formed in the cell region in the NAND flash memory device includes a plurality of word lines WL1, WL2, WL3, . . . , and WLm. In general, 32 or 64 word lines are arranged on each string. Unit cell transistors connected to the word lines WL1, WL2, WL3, . . . , and WLm are included. A cell selection line SSL and a ground selection line GSL are arranged on two outermost sides of the arrangement of the word lines WL1, WL2, WL3, . . . , and WLm, respectively. A cell selection transistor and a ground selection transistor connected to the cell selection line SSL and the ground selection line GSL, respectively, are included.

An impurity region of the cell selection transistor is connected to a bit line, and an impurity region of the ground selection transistor is connected to a common source line CSL. The common source line CSL extends while connecting other strings arranged in a direction of the word lines WL1, WL2, WL3, . . . , and WLm with one another. As shown in FIG. 25, cells strings are symmetrically arranged about a single common source line CSL.

NAND flash cell circuits shown in FIG. 25 are implemented on a substrate. As described above, the substrate may include a structure obtained by sequentially stacking a semiconductor substrate, a tunneling isolation layer, a charge storing layer, a blocking insulation layer, and a gate conductive layer.

Referring to FIG. 26, the upper surface of a semiconductor substrate is divided into an active region for installing circuits, and an isolation region for electrically isolating devices from one another.

The active region includes active patterns 350 that have line shapes extending in a second direction and are repeatedly arranged. Each of the active patterns 350 has a line width as small as the critical line width of photolithography. Trenches (not shown) are formed between the active patterns 350, and isolation layer patterns (not shown) are formed by filling the trenches with an insulation material.

Cell transistors 354, word lines 360, and selection transistors 356 are installed on the active patterns 350.

Figure 29A:
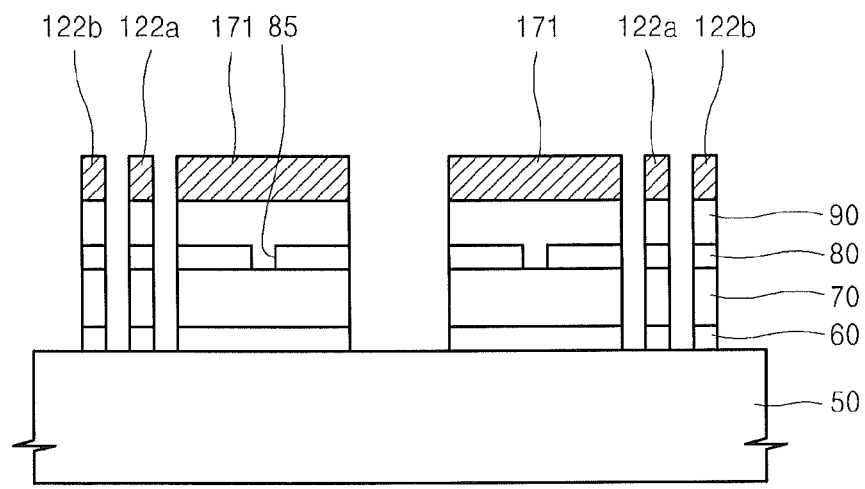
Figure 29B:
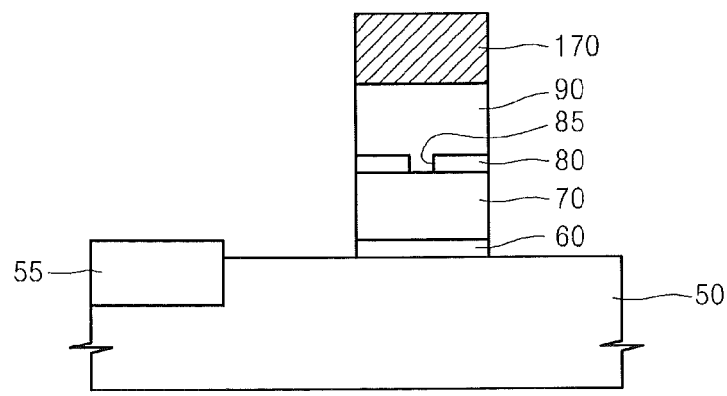

The cell transistor 354 may include a structure obtained by sequentially stacking a tunneling isolation layer 60 of FIG. 29B, a charge storing layer 70 of FIG. 29B, a blocking insulation layer 80 of FIG. 29B, and a gate conductive layer 90 of FIG. 29B. The tunneling isolation layer 60 of FIG. 29B is formed on the surface of the active pattern 350. The gate conductive layer 90 of FIG. 29B corresponds to the word lines 360, and each of the word lines 360 may extend in a first direction.

The word lines 360 may have a shape of a pattern structure array according to the above-described embodiments of the inventive subject matter. In other words, the word lines 360 may have a shape of a pattern structure array in which the pattern structures 122 of FIG. 22B are repeated. Pads 361 having relatively large line widths are connected to respective one ends of the word lines 360. A first contact plug 368a electrically contacting each of the pads 361 is installed on each of the pads 361.

Each of the selection transistors 356 may include the tunneling isolation layer 60 of FIG. 29B, the charge storing layer 70 of FIG. 29B, the blocking insulation layer 80 of FIG. 29B, and the gate conductive layer 90 of FIG. 29B, similar to the cell transistors 354. However, since a selection transistor does not require a data storage function, the tunneling isolation layer 60 of FIG. 29B servers as a gate insulation layer, and the charge storing layer 70 of FIG. 29B, the blocking insulation layer 80 of FIG. 29B, and the gate conductive layer 90 of FIG. 29B serve as a gate electrode 362. The blocking insulation layer 80 of FIG. 29B may include a butting contact hole 85 so that the charge storing layer 70 of FIG. 29B and the gate conductive layer 90 of FIG. 29B may function as a single gate electrode 362.

The gate electrode 362 has a line shape extending in the first direction. The gate electrode 362 included in the selection transistor 356 may have a sufficiently large line width, compared with the word lines 360.

Similar to the gate electrode 362 included in the selection transistor 356, the tunneling isolation layer 60 of FIG. 29B included in a gate electrode 390 formed in the peripheral region may serve as a gate insulation layer, and the charge storing layer 70 of FIG. 29B, the blocking insulation layer 80 of FIG. 29B, and the gate conductive layer 90 of FIG. 29B may serve as the gate electrode 362. The blocking insulation layer 80 of FIG. 29B may include the butting contact hole 85. The gate electrode 390 in the peripheral region may have a sufficiently large line width, compared with the word lines 360.

As described above, the gate electrode 390 formed in the peripheral region may be formed through a separate patterning process in order to prevent the pitting phenomenon. The gate electrode 362 of the selection transistor 356 also may have a large line width compared with the word lines 360, and thus the possibility that pitting occurs exists. Accordingly, not the gate electrode 390 in the peripheral region but the gate electrode 362 in the cell region may undergo a special patterning process. This will now be described in greater detail with reference to FIGS. 27A through 29A.

Figure 27A:
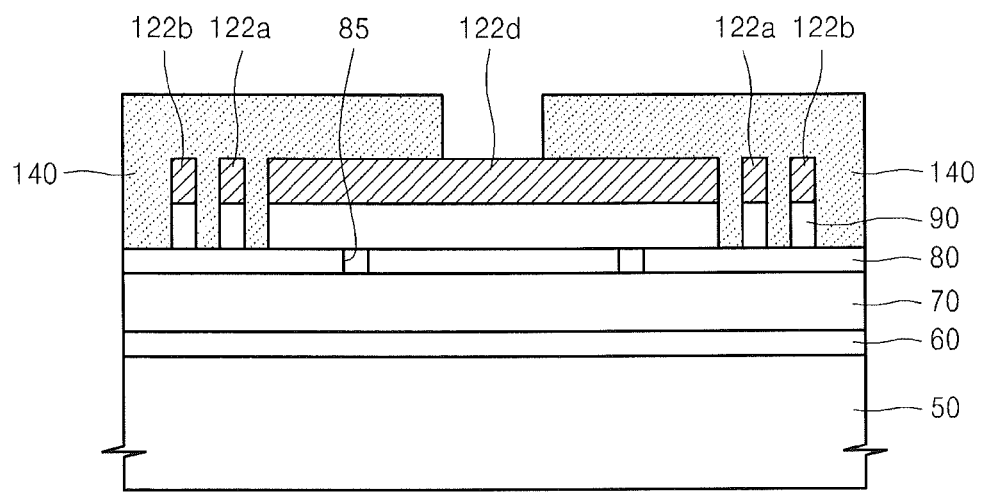
FIGS. 27A through 29B are cross-sectional views illustrating operations for fabricating semiconductor devices according to some embodiments of the inventive subject matter.

FIGS. 27A through 29B are cross-sectional views illustrating operations for fabricating semiconductor devices according to some embodiments of the inventive subject matter. FIGS. 27A, 28A, and 29A are cross-sectional views of a semiconductor device taken along line A-A', and FIGS. 27B, 28B, and 29B are plan views of the semiconductor device taken along line B-B'. The fabrication operations according to the illustrated embodiments are a partial modification of the operations shown in FIGS. 18 through 22B. Duplicated descriptions between embodiments will now be omitted.

Referring to FIG. 27A, a third photoresist layer (not shown) is formed on the first and second patterns 122a and 122b and a bulk pattern 122d of the cell region, and then is patterned to form a third photoresist pattern 140 exposing the upper surface of the bulk pattern 122d. The bulk pattern 122d is used to form the gate electrode 362 of FIG. 26 of the selection transistor, and may have a line width greater than the critical line width of photolithography.

Figure 27B:
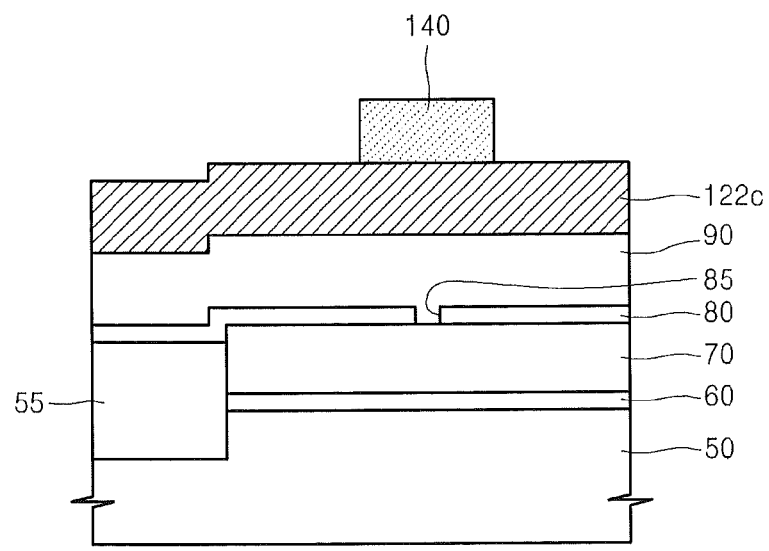

Referring to FIG. 27B, the third photoresist layer is formed on the third pattern 122c of the peripheral region and then is patterned to form a third photoresist pattern 140 for forming a circuit pattern of the peripheral region.

Figure 28A:
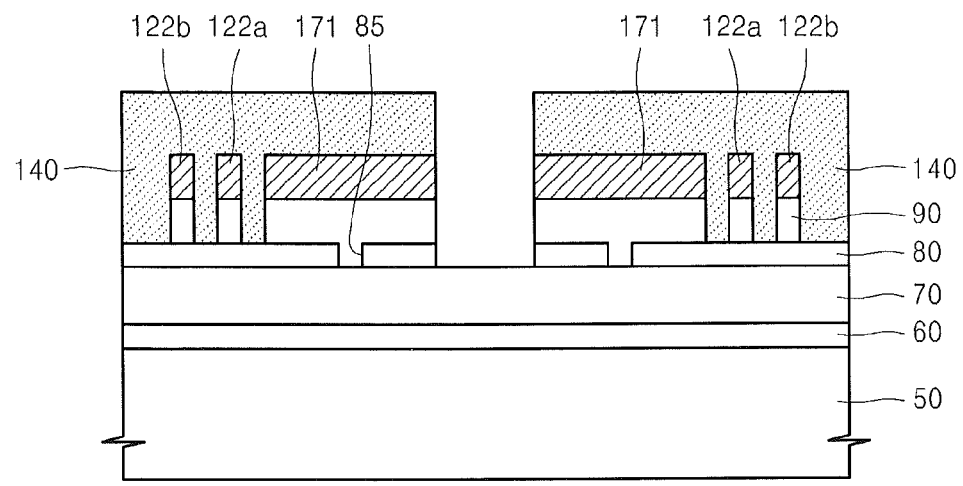

Referring to FIG. 28A, the exposed portion of the bulk pattern 122d, the gate conductive layer 90, and the blocking insulation layer 80 are sequentially etched using the third photoresist pattern 140 of the cell region as an etch mask. A selection transistor pattern 171 is formed by etching the bulk pattern 122d.

Figure 28B:
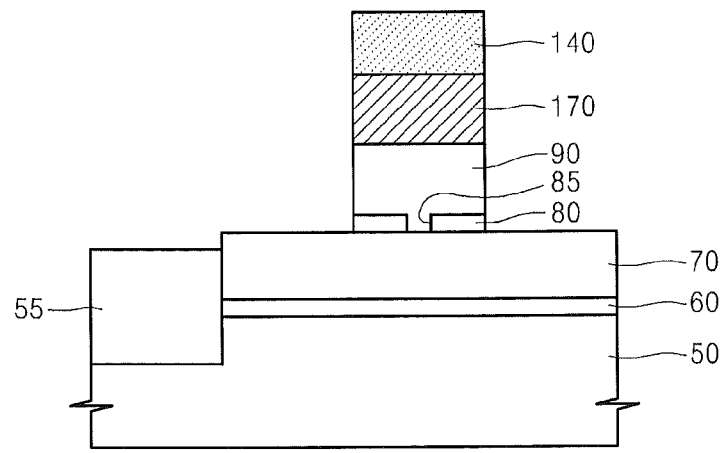

Similarly, referring to FIG. 28B, the third pattern 122c, the gate conductive layer 90, and the blocking insulation layer 80 are sequentially etched using the third photoresist pattern 140 of the peripheral region as an etch mask. A circuit pattern 170 of the peripheral region is formed by etching the third pattern 122c.

Thereafter, referring to FIG. 29A, the third photoresist pattern 140 of the cell region is removed, and the blocking insulation layer 80, the charge storing layer 70, and the tunneling isolation layer 60 are sequentially etched using the first and second patterns 122a and 122b and the bulk pattern 122d as an etching mask. Two selection transistors 356 of FIG. 26 may be formed by the etching process.

Referring to FIG. 29B, the third photoresist pattern 140 of the cell region is removed, and the blocking insulation layer 80, the charge storing layer 70, the tunneling isolation layer 60, and the isolation layer 55 are sequentially etched using the first and second patterns 122a and 122b and the bulk pattern 122d as an etching mask. The gate electrode 390 of FIG. 26 of the peripheral region may be formed by the etching process.

As described above, while photolithography is separately being performed after a double patterning process, not only the third pattern 122c of the peripheral region but also the bulk pattern 122d of the cell region may be patterned. Accordingly, pitting of the bulk pattern 122d of the cell region as well as pitting of the third pattern 122c of the peripheral region, both of which may occur during the double patterning process, may be prevented.

As described above, the third pattern 122c is used as a mask for forming a driving circuit of the peripheral region, and the bulk pattern 122d is used as a mask for forming the selection transistor of the cell region.

Figure 30:
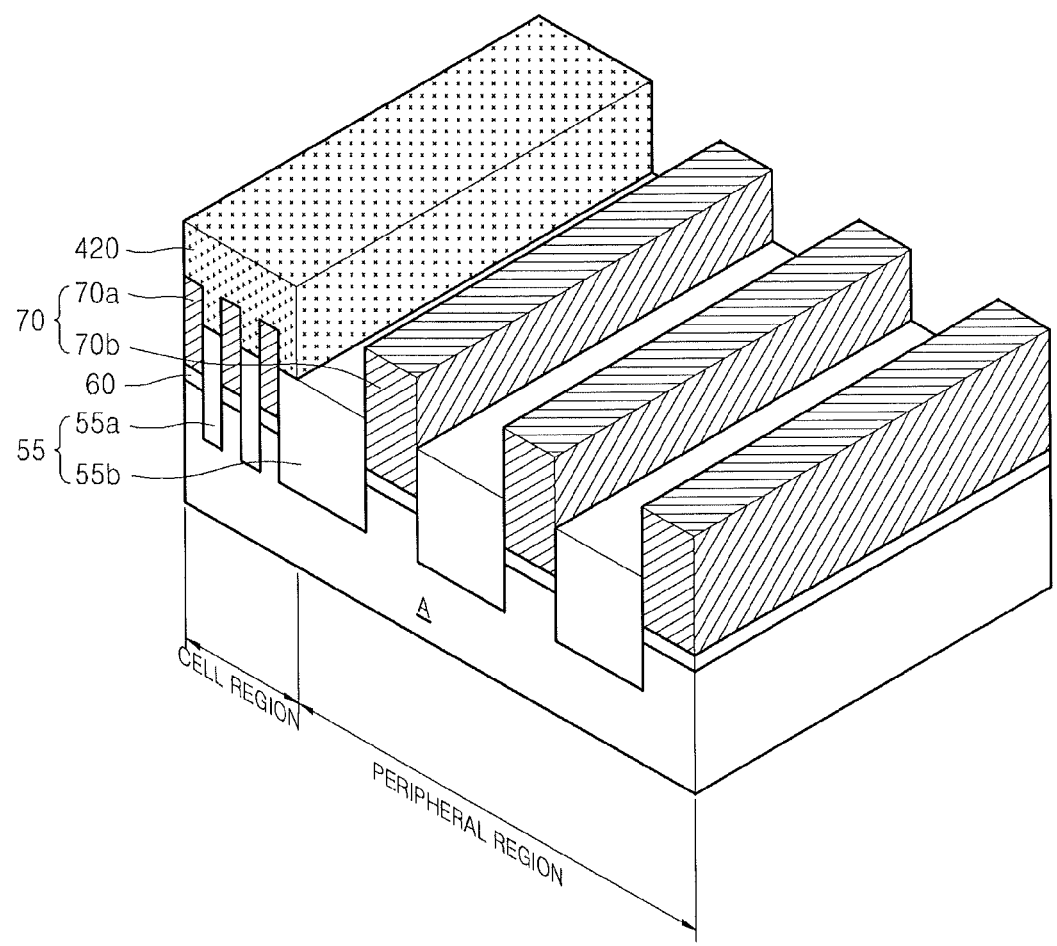
FIGS. 30 through 33B are cross-sectional views illustrating operations for fabricating semiconductor devices according to some embodiments of the inventive subject matter.
Figure 31:
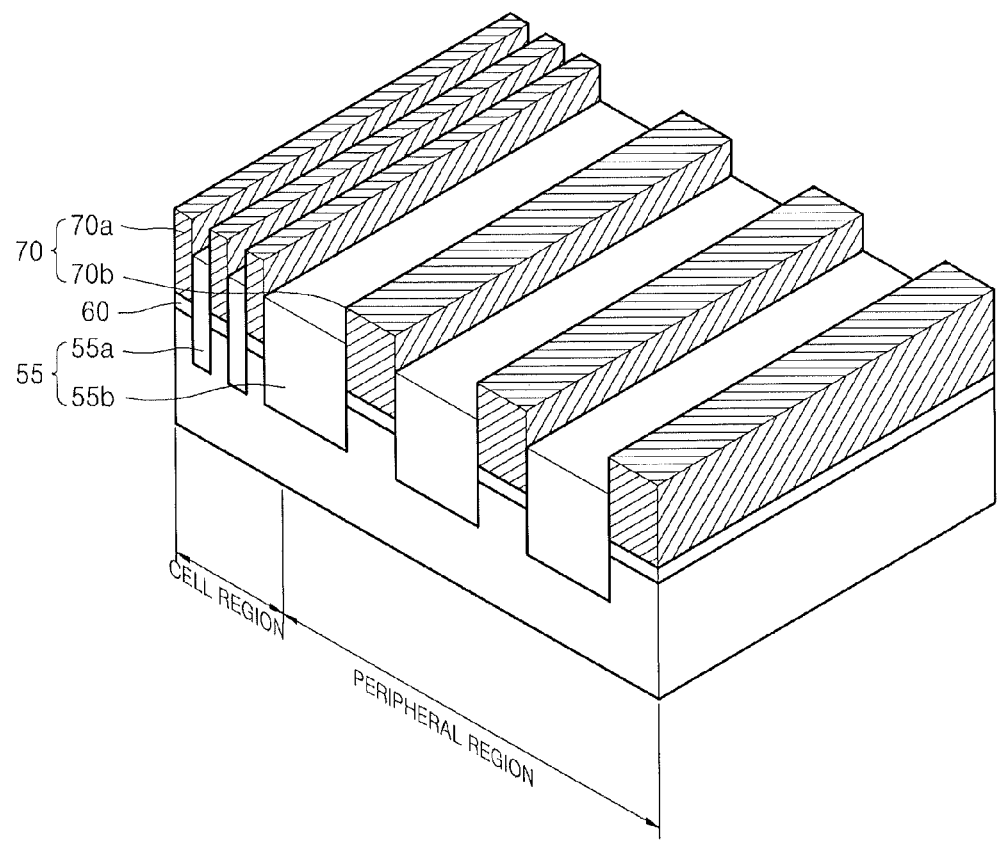

FIGS. 30 through 33B illustrate operations for fabricating semiconductor devices according to some embodiments of the inventive subject matter. FIGS. 30 and 31 illustrate a partial modification of the semiconductor device manufacturing operations shown in FIGS. 23 and 24, and FIGS. 32A through 33B illustrate a partial modification of the semiconductor device manufacturing operations shown in FIGS. 28A through 29B.

As described above with reference to FIG. 24, due to the etching of the isolation layer 55, a step difference may be generated between the charge storing layer 70a formed in the peripheral region and the charge storing layer 70b formed in the cell region. In this case, referring to FIG. 30, a photoresist pattern 420 is formed on the charge storing layer 70a formed in the cell region, and only the charge storing layer 70b formed in the peripheral region is exposed. Thereafter, referring to FIG. 31, the step difference between the charge storing layer 70a formed in the peripheral region and the charge storing layer 70b formed in the cell region may be removed by etching the charge storing layer 70b formed in the peripheral region.

In other words, in the above-described fabrication operations (for example, the operations illustrated in FIGS. 18 through 22B (and FIGS. 23 and 24) or the fabrication operations illustrated in FIGS. 27A through 29B), formation of a stringer (a remaining charge storing layer 70b) may occur due to a difference between the heights of a charge storing layer formed in the peripheral region and a charge storing layer formed in the cell region. Accordingly, in FIGS. 21, 28A, and 28B, a blocking insulation layer formed in the peripheral region is previously etched during an etching process based on special photolithography in order to prevent the stringer disorder, and thus the charge storing formed in the peripheral region is completely etched although the same etching process is conducted on both the cell region and the peripheral region.

However, in the fabrication operations according to the illustrated embodiments, removal of the difference between the heights of the charge storing layers 70a and 70b, which may be generated during the formation of the isolation layer 55, is performed before a double patterning process, so that formation of the stringer may be prevented and double patterning, photolithography, and the like may be more accurately performed.

Figure 32A:
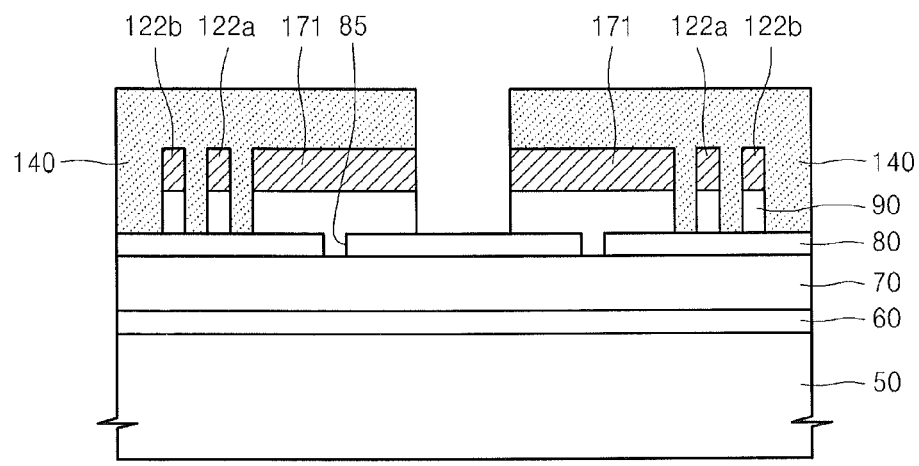
Figure 32B:
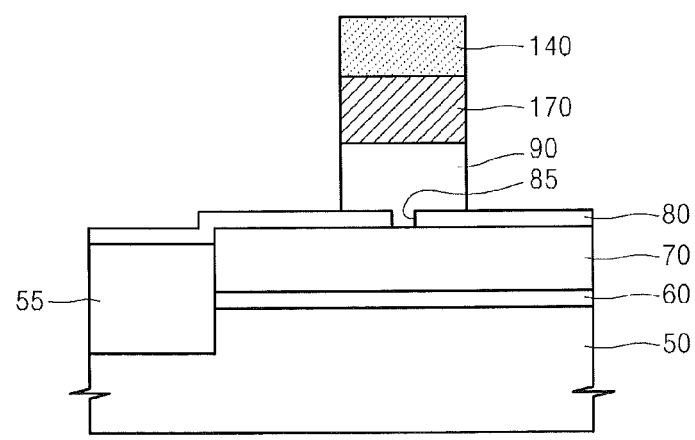

Referring to FIGS. 32A and 32B, in contrast with FIGS. 28A and 28B in which the bulk pattern 122d, the third pattern 122c, the gate conductive layer 90, and the blocking insulation layer 80 are sequentially etched to prevent stringer breakdown, the exposed portion of the bulk pattern 122d, the third pattern 122c, and the gate conductive layer 90 are sequentially etched using the third photoresist pattern 140 of the cell region and the peripheral region as an etch mask, and the blocking insulation layer 80 is not etched out.

Figure 33A:
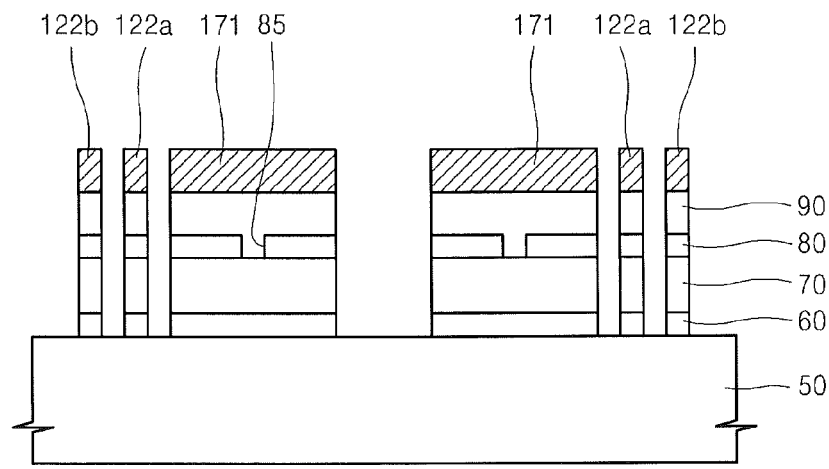
Figure 33B:
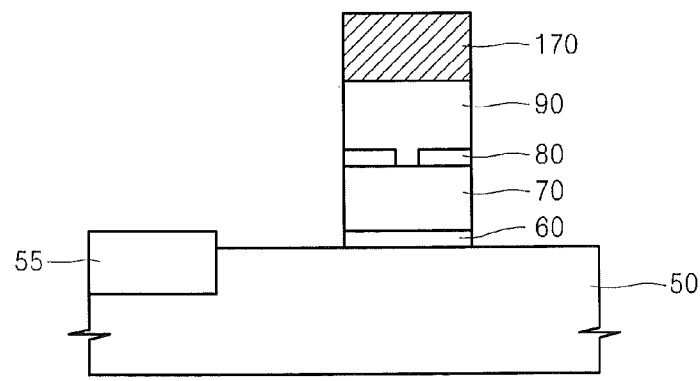

Referring to FIGS. 33A and 33B, the third photoresist pattern 140 is removed, and the blocking insulation layer 80, the charge storing layers 70a and 70b, and the tunneling isolation layer 60 are sequentially etched using the first and second patterns 122a and 122b and the bulk pattern 122d as an etching mask, thereby forming a selection transistor and a circuit pattern. Since the heights of the charge storing layer 70a of the cell region and the charge storing layer 70b of the peripheral region are equalized to each other due to the process of FIG. 24, the blocking insulation layer 80 of the peripheral region does not need to be etched.

Figure 34:
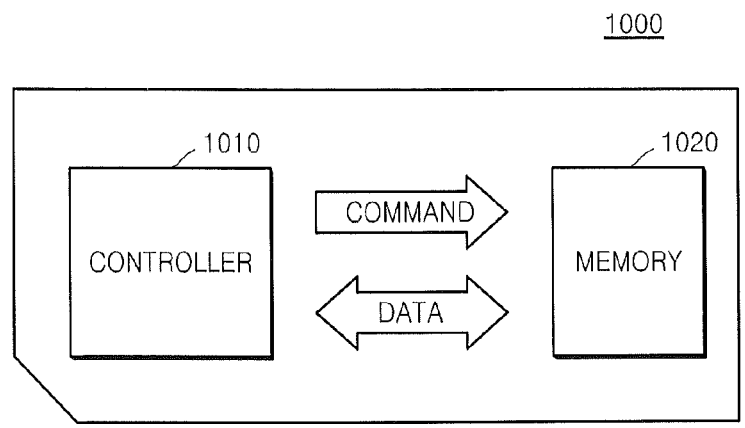
FIG. 34 is a schematic diagram of a card including a semiconductor device fabricated according to some embodiments of the inventive subject matter.

FIG. 34 is a schematic diagram of a card 1000 including a semiconductor device fabricated using any of the fabrication operations according to the above-described embodiments of the inventive subject matter.

Referring to FIG. 34, a controller 1010 and a memory 1020 may be arranged to exchange electrical signals with each other. For example, when a command is issued by the controller 1010, the memory 1020 may transmit data. The memory 1020 may include a semiconductor device fabricated using the fabrication operations according to one of the above-described embodiments of the inventive subject matter. The semiconductor devices may be arranged in a "NAND" and "NOR" architecture memory array (not shown) according to a corresponding logic gate design as well known to one of ordinary skill in the art. The memory array includes a plurality of rows and columns and may constitute at least one array bank (not shown). The memory 1020 may include such a memory array (not shown) or such as a memory array bank (not shown). The card 1000 may further include a typical row decoder (not shown), a typical column decoder (not shown), input/output (I/O) buffers (not shown), and/or a control register (not shown) in order to drive the above-described memory array bank. The card 1000 may be used in a memory device such as any card, for example, a memory stick card, a smart media (SM) card, a secure digital (SD) card, a mini SD card, or a multi media card (MMC).

Figure 35:
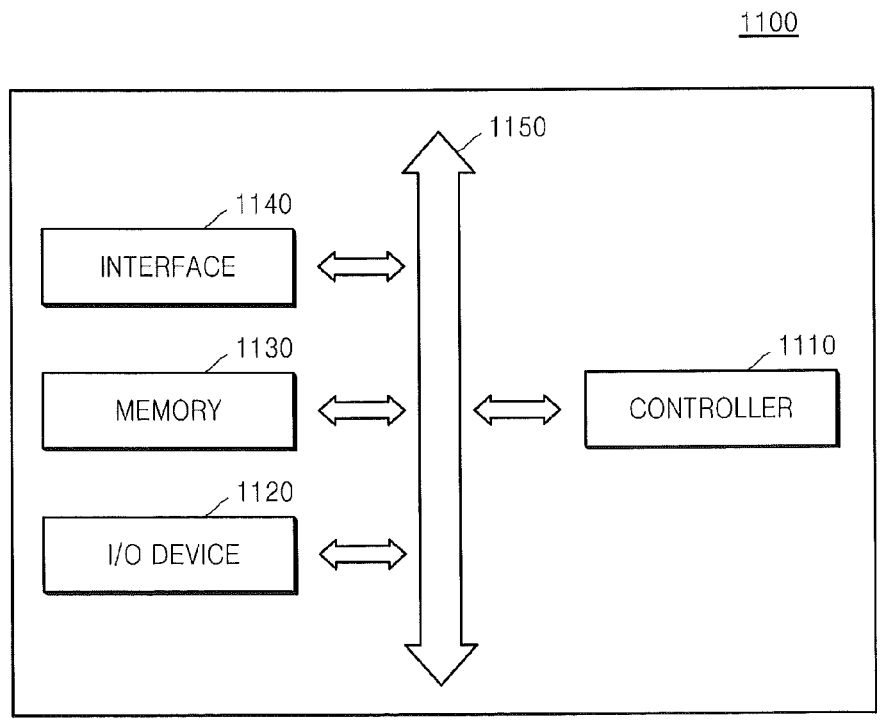
FIG. 35 is a schematic diagram of a system including a semiconductor device fabricated according to some embodiments of the inventive subject matter.

FIG. 35 is a schematic diagram of a system 1100 including the semiconductor device fabricated using the fabrication operations according to one of the above-described embodiments of the inventive subject matter.

Referring to FIG. 35, the system 1100 may include a controller 1110, an I/O device 1120, a memory 1130, and an interface 1140. The system 1100 may be a system that transmits or receives a mobile system or information. The mobile system may be a PDA, a portable computer, a web tablet, a wireless phone, a mobile phone, a digital music player, or a memory card. The controller 1110 may execute a program and control the system 1100. The controller 1110 may be a microprocessor, a digital signal processor, a microcontroller, or a device similar to these devices. The I/O device 1120 may be used to input or output the data of the system 1100. The system 1100 may be connected to an external device, for example, a personal computer or a network, by using the I/O device 1130, and thus may exchange data with the external device. The I/O device 1120 may be a keypad, a keyboard, or a display. The memory 1130 may store a code and/or data for operating the controller 1110, and/or store data processed by the controller 1110. The memory 1130 may include a semiconductor device fabricated using the fabrication operations according to one of the embodiments of the inventive subject matter. The interface 1140 may be a data transmission path between the system 1100 and another external device. The controller 1110, the I/O device 1120, the memory 1130, and the interface 1140 may communicate with each other via a bus 1150. For example, the system 1100 may be used in a mobile phone, an MP3 player, a navigation (GPS) device, a portable multimedia player (PMP), a solid state disk (SSD), or household appliances.

While the inventive subject matter has been particularly shown and described with reference to exemplary embodiments thereof, it will be understood that various changes in form and details may be made therein without departing from the spirit and scope of the following claims.

What is claimed is:
1. A method comprising:
    forming an etching target layer on a substrate comprising a cell region, a connection region, and a peripheral region;
    forming a sacrificial layer on the etching target layer;
    patterning the sacrificial layer to form a sacrificial pattern on the cell region and the connection region;
    forming at least one sidewall spacer on the sacrificial pattern;
    etching the etching target layer using the at least one sidewall spacer as an etch mask in the cell region and using the at least one sidewall spacer and the sacrificial pattern as an etch mask in the connection region to form a first pattern on the cell region and the connection region;
    forming a photoresist layer covering the first pattern;
    patterning the photoresist layer in the peripheral region to form a photoresist pattern on the peripheral region; and
    etching the etching target layer in the peripheral region using the photoresist pattern as an etch mask to form a second pattern in the peripheral region.
2. The method of claim 1, further comprising:
    patterning a portion of the photoresist layer on the cell region to form a photoresist pattern on the cell region while patterning the photoresist layer in the peripheral region to form the photoresist pattern on the peripheral region;

etching the etching target layer in the cell region using the photoresist pattern in the cell region as an etch mask to for a third pattern in the cell region; and forming a gate electrode of a selection transistor in the cell region using the third pattern as a mask and forming a driving circuit in the peripheral region using the second pattern as a mask.

3. The method of claim 1, wherein the substrate comprises:
a semiconductor substrate;
a tunneling isolation layer on the semiconductor substrate;
a charge storing layer on the tunneling isolation layer;
a blocking insulation layer on the charge storing layer; and
a gate conductive layer on the blocking insulation layer.

4. The method of claim 3, comprising etching a portion of the gate conductive layer in the cell region while etching the etching target layer using the at least one sidewall spacer as the etch mask in the cell region and using the at least one sidewall spacer and the sacrificial pattern as the etch mask in the connection region to form a first pattern on the cell region and the connection region.

5. The method of claim 4, comprising etching a portion of the gate conductive layer in the peripheral region while etching the etching target layer in the peripheral region using the photoresist pattern as an etch mask to form the second pattern in the peripheral region.

6. The method of claim 5, comprising etching a portion of the blocking insulation layer in the peripheral region while etching the etching target layer in the peripheral region using the photoresist pattern as an etch mask to form the second pattern in the peripheral region.

7. The method of claim 3, wherein forming the etching target layer is preceded by:
sequentially forming the tunneling isolation layer and the charge storing layer on the semiconductor substrate;
etching the tunneling isolation layer, the charge storing layer and the semiconductor substrate to form a trench;
forming an isolation layer that fills the trench;
etching the isolation layer such that consumption of the isolation layer is greater than consumption of the charge storing layer; and
forming a blocking insulation layer on the charge storing layer and the isolation layer.

8. The method of claim 7, wherein forming the blocking insulation layer is preceded by etching a portion of the charge storing layer in the peripheral region so that a height of the charge storing layer in the cell region is substantially the same as a height of the charge storing layer in the peripheral region.

9. The method of claim 1, wherein forming the sacrificial layer comprises forming a first material layer on the substrate and forming a second material layer pattern on the first material layer, and wherein patterning the sacrificial layer to form the sacrificial pattern on the cell region and the connection region comprises forming a first material layer pattern by etching the first material layer using the second material layer pattern as an etch mask.

10. The method of claim 9, wherein during the forming of the first material layer pattern, a portion of the second material layer pattern in the cell region is more etched than a portion of the second material layer pattern in the peripheral region.

11. The method of claim 9, wherein etching the etching target layer using the at least one sidewall spacer as the etch mask in the cell region and using the at least one sidewall spacer and the sacrificial pattern as the etch mask in the connection region to form the first pattern on the cell region and the connection region is preceded by removing the second material layer pattern under an etching condition that a portion of the second material layer pattern in the cell region is more etched than a portion of the second material layer pattern in the peripheral region.

12. The method of claim 1, wherein forming the at least one sidewall spacer on the sacrificial pattern comprises:
forming a spacer formation layer on the sacrificial pattern; and
etching the spacer formation layer to form the at least one sidewall spacer.

13. The method of claim 1, wherein during the forming of the sacrificial pattern, a portion of the sacrificial layer in the peripheral region is not patterned.

14. The method of claim 1, wherein during the forming of the photoresist pattern, a portion of the photoresist layer in the cell region and the connection region is not patterned.

15. A method comprising:
forming a sacrificial pattern on a substrate;
forming a spacer formation layer on the substrate, the spacer formation layer covering the sacrificial pattern;
forming a photoresist pattern exposing a portion of the spacer formation layer on a sidewall of the sacrificial pattern;
etching to remove the exposed portion of the spacer formation layer and an adjacent portion of the sacrificial pattern while leaving a portion of the spacer formation layer overlying the removed adjacent portion of the sacrificial pattern;
etching the spacer formation layer to expose an upper surface of the sacrificial pattern and to leave at least one spacer on at least one sidewall of the sacrificial pattern;
removing a first portion of the sacrificial pattern having a first width while leaving intact a second portion of the sacrificial pattern having a second width greater than the first width to thereby form a composite mask pattern comprising the at least one spacer and the second portion of the sacrificial pattern; and
etching an underlying portion of the substrate using the composite mask pattern as an etching mask.

16. The method of claim 15, wherein the first portion of the sacrificial pattern overlies a cell region of the substrate and wherein the second portion of the sacrificial pattern overlies a connection region of the substrate.

17. The method of claim 15, wherein removing the first portion of the sacrificial layer having the first width while leaving intact the second portion of the sacrificial layer having a second width greater than the first width to thereby form the composite mask pattern comprising the at least one spacer and the second portion of the sacrificial pattern comprises at least two etching operations.

18. The method of claim 17:
wherein the sacrificial pattern comprises a first material layer on the substrate and a second material layer on the first material layer;
wherein etching the spacer formation layer to expose the upper surface of the sacrificial pattern and to leave the at least one spacer on the at least one sidewall of the sacrificial pattern comprises etching the spacer formation layer to expose an upper surface of the second material layer;
wherein removing the first portion of the sacrificial pattern having the first width while leaving intact the second portion of the sacrificial pattern having the second width greater than the first width to thereby form the composite mask pattern comprising the at least one spacer and the second portion of the sacrificial pattern comprises:
etching the exposed second material layer to remove a portion of the second material layer of the first portion of the sacrificial pattern and expose at portion of the first material layer between spacer portions while leaving intact a portion of the second material layer of the second portion of the sacrificial pattern; and etching to remove the exposed portion of the first material layer.

19. The method of claim 15:

wherein forming the sacrificial pattern on a substrate is preceded by forming a sacrificial layer on the substrate;

wherein forming the sacrificial pattern on a substrate comprises patterning the sacrificial layer to form the sacrificial pattern on cell and connection regions of the substrate while leaving a portion of the sacrificial layer on a peripheral region of the substrate;

wherein the spacer formation layer covers the sacrificial pattern and the portion of the sacrificial layer on the peripheral region;

wherein etching the spacer formation layer to expose the upper surface of the sacrificial pattern and to leave the at least one spacer on the at least one sidewall of the sacrificial pattern comprises etching the spacer formation layer to expose an upper surface of the portion of the sacrificial layer on the peripheral region;

wherein removing the first portion of the sacrificial pattern having the first width while leaving intact the second portion of the sacrificial pattern having the second width greater than the first width to thereby form the composite mask pattern comprising the at least one spacer and the second portion of the sacrificial layer comprises leaving the portion of the sacrificial layer on the peripheral region;

wherein etching the underlying portion of the substrate using the composite mask pattern as the etching mask comprises etching the underlying portion of the substrate using the composite mask pattern as the etching mask to form a first pattern in the cell and connection regions and to leave a material layer in the peripheral region; and wherein the method further comprises:

forming a mask pattern that covers the pattern in the cell and connection regions and that exposes at least a portion of the material layer in the peripheral region; and etching the exposed portion of the material layer in the peripheral region to form a second pattern in the peripheral region.

* * * * *